(12) United States Patent
Kim et al.

(10) Patent No.: US 12,396,241 B2
(45) Date of Patent: Aug. 19, 2025

(54) SEMICONDUCTOR DEVICE

(71) Applicant: SAMSUNG ELECTRONICS CO., LTD., Suwon-si (KR)

(72) Inventors: Juyoun Kim, Suwon-si (KR); Sangjung Kang, Suwon-si (KR); Jinwoo Kim, Hwaseong-si (KR); Yoori Sung, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 477 days.

(21) Appl. No.: 17/892,415

(22) Filed: Aug. 22, 2022

(65) Prior Publication Data

US 2023/0178625 A1  Jun. 8, 2023

(30) Foreign Application Priority Data

Dec. 7, 2021 (KR) ........................ 10-2021-0173998

(51) Int. Cl.
| | | |
|---|---|---|
| H10D 64/66 | (2025.01) | |
| H01L 21/28 | (2025.01) | |
| H10D 62/13 | (2025.01) | |
| H10D 64/27 | (2025.01) | |
| H10D 64/68 | (2025.01) | |
| H10D 84/01 | (2025.01) | |
| H10D 84/03 | (2025.01) | |

(52) U.S. Cl.
CPC ..... *H10D 64/667* (2025.01); *H01L 21/28026* (2013.01); *H10D 62/151* (2025.01); *H10D 64/411* (2025.01); *H10D 64/691* (2025.01); *H10D 84/0142* (2025.01); *H10D 84/038* (2025.01)

(58) Field of Classification Search
CPC .. H10D 64/667; H10D 64/691; H10D 62/151; H10D 64/411; H10D 84/0142; H10D 84/038; H01L 21/28026
See application file for complete search history.

(56) References Cited

U.S. PATENT DOCUMENTS

| | | |
|---|---|---|
| 8,106,469 B2 | 1/2012 | Xu et al. |
| 8,637,390 B2 | 1/2014 | Ganguli et al. |
| 9,466,494 B2 | 10/2016 | Wu et al. |
| 9,559,181 B2 | 1/2017 | Ching et al. |
| 9,882,032 B2 | 1/2018 | Ching et al. |

(Continued)

*Primary Examiner* — Christine A Enad
(74) *Attorney, Agent, or Firm* — Muir Patent Law, PLLC

(57) ABSTRACT

A semiconductor device includes a substrate including PMOSFET and NMOSFET regions; and first/second transistors on the PMOSFET/NMOSFET regions, respectively, wherein the first transistor includes a first gate dielectric layer on the substrate; a first lower metal pattern on the first gate dielectric layer; a second lower metal pattern on the first lower metal pattern; and a first intermediate pattern between the first and second lower metal patterns, the second transistor includes a second gate dielectric layer on the substrate; a third lower metal pattern on the second gate dielectric layer; and a second intermediate pattern between the second gate dielectric layer and the third lower metal pattern, the first and second intermediate patterns each include lanthanum, the first to third lower metal patterns each include a metal nitride, and a thickness of the first lower metal pattern is greater than a thickness of the third lower metal pattern.

20 Claims, 41 Drawing Sheets

(56) References Cited

U.S. PATENT DOCUMENTS

| | | |
|---|---|---|
| 10,486,149 B2 | 11/2019 | Dadheech et al. |
| 10,622,356 B2 | 4/2020 | Chang et al. |
| 2019/0096770 A1* | 3/2019 | Hong ................ H10D 84/0144 |
| 2019/0326284 A1 | 10/2019 | Kim et al. |
| 2020/0006157 A1 | 1/2020 | Lee et al. |
| 2021/0074593 A1 | 3/2021 | Savant et al. |
| 2021/0098301 A1 | 4/2021 | Wu et al. |
| 2021/0257263 A1* | 8/2021 | More ................ H01L 21/02181 |
| 2021/0367036 A1* | 11/2021 | Kim ..................... H10D 62/822 |
| 2023/0062210 A1* | 3/2023 | Wei ..................... H10D 84/0172 |

\* cited by examiner

SEMICONDUCTOR DEVICE

CROSS-REFERENCE TO RELATED APPLICATION

This U.S. nonprovisional application claims priority under 35 U.S.C. § 119 to Korean Patent Application No. 10-2021-0173998 filed on Dec. 7, 2021, in the Korean Intellectual Property Office, the disclosure of which is hereby incorporated by reference in its entirety.

BACKGROUND

1. Field

Embodiments relate to a semiconductor device.

2. Description of the Related Art

A semiconductor device may include an integrated circuit including metal oxide semiconductor field effect transistors (MOSFETs). As sizes and design rules of the semiconductor device are gradually decreased, sizes of the MOSFETs may also be scaled down.

SUMMARY

The embodiments may be realized by providing a semiconductor device including a substrate that includes a PMOSFET region and an NMOSFET region; and a first transistor on the PMOSFET region and a second transistor on the NMOSFET region, wherein the first transistor includes a first gate dielectric layer on the substrate; a first lower metal pattern on the first gate dielectric layer; a second lower metal pattern on the first lower metal pattern; and a first intermediate pattern between the first lower metal pattern and the second lower metal pattern, the second transistor includes a second gate dielectric layer on the substrate; a third lower metal pattern on the second gate dielectric layer; and a second intermediate pattern between the second gate dielectric layer and the third lower metal pattern, the first intermediate pattern and the second intermediate pattern each include lanthanum, the first lower metal pattern, the second lower metal pattern, and the third lower metal pattern each include a metal nitride, and a thickness of the first lower metal pattern is greater than a thickness of the third lower metal pattern.

The embodiments may be realized by providing a semiconductor device including a substrate that includes a PMOSFET region and an NMOSFET region; and a first transistor on the PMOSFET region, wherein the first transistor includes a first gate dielectric layer on the substrate; a first lower metal pattern on the first gate dielectric layer; a second lower metal pattern on the first lower metal pattern; and an upper metal pattern on the second lower metal pattern, the first lower metal pattern and the second lower metal pattern each include a metal nitride, the upper metal pattern includes aluminum, a lanthanum concentration of the second lower metal pattern gradually increases with increasing distance from the upper metal pattern, and a lanthanum concentration of the first lower metal pattern gradually decreases with increasing distance from the upper metal pattern.

The embodiments may be realized by providing a semiconductor device including a substrate including a PMOSFET region and an NMOSFET region that are spaced apart from each other in a first direction; a first active pattern on the PMOSFET region and a second active pattern on the NMOSFET region; a first source/drain pattern on the first active pattern and a second source/drain pattern on the second active pattern; a first gate electrode that runs across the first active pattern and a second gate electrode that runs across the second active pattern, the first gate electrode and the second gate electrode each extending in the first direction; a first gate dielectric layer between the first active pattern and the first gate electrode and a second gate dielectric layer between the second active pattern and the second gate electrode, the first gate dielectric layer and the second gate dielectric layer each including an interfacial layer and a high-k dielectric layer on the interfacial layer; a gate spacer on each of sidewalls of the first gate electrode and the second gate electrode; a gate capping pattern on each of top surfaces of the first gate electrode and the second gate electrode; a first interlayer dielectric layer on the gate capping pattern; an active contact that penetrates the first interlayer dielectric layer and is coupled to one of the first source/drain pattern or the second source/drain pattern; a gate contact that penetrates the first interlayer dielectric layer and is coupled to one of the first gate electrode or the second gate electrode; a second interlayer dielectric layer on the first interlayer dielectric layer; a first metal layer in the second interlayer dielectric layer, the first metal layer including a plurality of lower lines electrically connected to the active contact and the gate contact; a third interlayer dielectric layer on the second interlayer dielectric layer; and a second metal layer in the third interlayer dielectric layer, wherein the second metal layer includes a plurality of upper lines electrically connected to corresponding lower lines, the first gate electrode includes a first lower metal pattern on the first gate dielectric layer; a second lower metal pattern on the first lower metal pattern; a first intermediate pattern between the first lower metal pattern and the second lower metal pattern; and a first upper metal pattern on the second lower metal pattern, the second gate electrode includes a third lower metal pattern on the second gate dielectric layer; a second intermediate pattern between the second gate dielectric layer and the third lower metal pattern; and a second upper metal pattern on the third lower metal pattern, the first intermediate pattern and the second intermediate pattern each include lanthanum, and the first lower metal pattern, the second lower metal pattern, and the third lower metal pattern each include a metal nitride.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
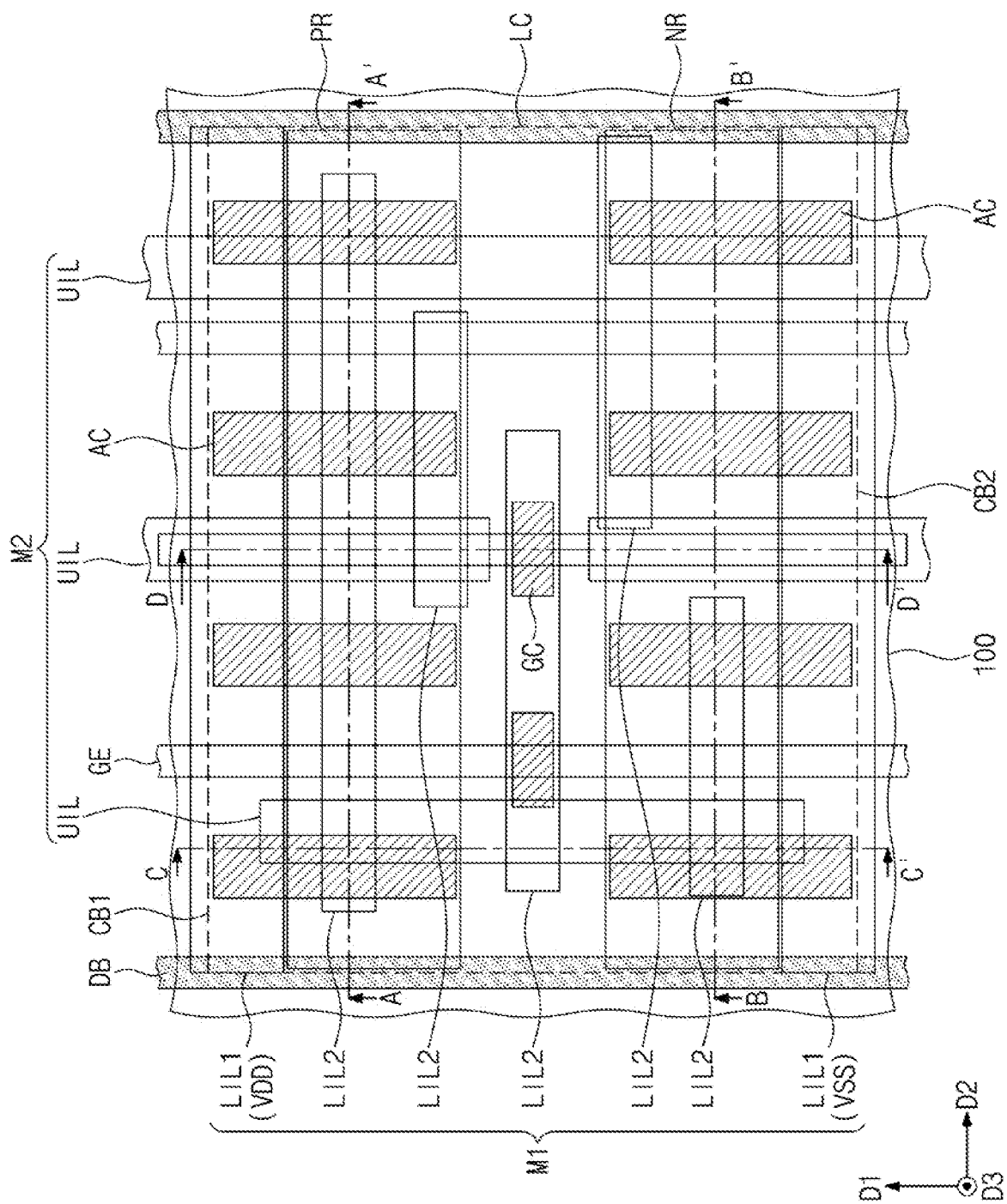
FIG. 1 illustrates a plan view of a semiconductor device according to some embodiments.

FIG. 1 illustrates a plan view of a semiconductor device according to some embodiments. FIGS. 2A, 2B, 2C, and 2D illustrate cross-sectional views respectively taken along lines A-A', B-B', C-C', and D-D' of FIG. 1.

Referring to FIGS. 1 and 2A to 2D, a logic cell LC may be provided on a substrate 100. In this description, the language "logic cell" may mean a logic element (e.g., inverter or flip-flop) to perform a specific function. In an implementation, the logic cell LC may include transistors to constitute a logic element, and may also include wiring lines to connect the transistors to each other.

The substrate 100 may include a PMOSFET region PR and an NMOSFET region NR. The substrate 100 may be a compound semiconductor substrate or a semiconductor substrate including silicon, germanium, silicon-germanium, or the like. In an implementation, the substrate 100 may be a silicon substrate. As used herein, the term "or" is not an exclusive term, e.g., "A or B" would include A, B, or A and B.

The PMOSFET region PR and the NMOSFET region NR may be defined by a second trench TR2 on or in an upper portion of the substrate 100. The second trench TR2 may be between the PMOSFET region PR and the NMOSFET region NR. The PMOSFET region PR and the NMOSFET region NR may be spaced apart from each other in a first direction D1 across the second trench TR2. The PMOSFET region PR and the NMOSFET region NR may extend (e.g., lengthwise) in a second direction D2 that intersects the first direction D1.

First active patterns AP1 and second active patterns AP2 may be on the PMOSFET region PR and the NMOSFET region NR, respectively. The first and second active patterns AP1 and AP2 may extend in parallel to each other in the second direction D2. The first and second active patterns AP1 and AP2 may be portions of the substrate 100 that protrude in a vertical direction (e.g., a third direction D3). A first trench TR1 may be between neighboring first active patterns AP1 and between neighboring second active patterns AP2. The first trench TR1 may be shallower than the second trench TR2.

A device isolation layer ST may fill the first and second trenches TR1 and TR2. The device isolation layer ST may include a silicon oxide layer. The first and second active patterns AP1 and AP2 may have their upper portions that vertically protrude upwardly from the device isolation layer ST (see FIG. 2D). Each of the first and second active patterns AP1 and AP2 may have a fin shape at the upper portion thereof. In an implementation, the number of fins of each of the first and second active patterns AP1 and AP2 may vary. The device isolation layer ST may not cover any of the upper portions of the first and second active patterns AP1 and AP2. The device isolation layer ST may cover lower sidewalls of the first and second active patterns AP1 and AP2.

The first active patterns AP1 may have first source/drain patterns SD1 on upper portions thereof. The first source/drain patterns SD1 may be impurity regions having a first conductivity type (e.g., p-type). A first channel pattern CH1 may be between a pair of first source/drain patterns SD1. The second active patterns AP2 may have second source/drain patterns SD2 on upper portions thereof. The second source/drain patterns SD2 may be impurity regions having a second conductivity type (e.g., n-type). A second channel pattern CH2 may be between a pair of second source/drain patterns SD2.

The first and second source/drain patterns SD1 and SD2 may be epitaxial patterns formed by a selective epitaxial growth process. In an implementation, the first and second source/drain patterns SD1 and SD2 may have top surfaces coplanar with those of the first and second channel patterns CH1 and CH2. In an implementation, the first and second source/drain patterns SD1 and SD2 may have top surfaces higher than those of the first and second channel patterns CH1 and CH2.

The first source/drain patterns SD1 may include a semiconductor element (e.g., SiGe) whose lattice constant is greater than that of a semiconductor element of the substrate 100. In an implementation, the first source/drain patterns SD1 may provide the first channel patterns CH1 with compressive stress. In an implementation, the second source/drain patterns SD2 may include the same semiconductor element (e.g., Si) as that of the substrate 100.

Gate electrodes GE may extend in the first direction D1 while running across the first and second active patterns AP1 and AP2. The gate electrodes GE may be arranged or spaced apart along the second direction D2 at a first pitch. The gate electrodes GE may vertically overlap the first and second channel patterns CH1 and CH2. Each of the gate electrodes GE may surround a top surface and opposite sidewalls of each of the first and second channel patterns CH1 and CH2.

In an implementation, the number of the gate electrodes GE on one logic cell LC may vary.

Referring back to FIG. 2D, the gate electrode GE may be on a first top surface TS1 of the first channel pattern CH1 and on at least one first sidewall SW1 of the first channel pattern CH1. The gate electrode GE may be on a second top surface TS2 of the second channel pattern CH2 and on at least one second sidewall SW2 of the second channel pattern CH2. In an implementation, a transistor according to the present embodiment may be a three-dimensional field effect transistor (e.g., FinFET) in which the gate electrode GE three-dimensionally surrounds the first and second channel patterns CH1 and CH2.

Referring back to FIGS. 1 and 2A to 2D, a pair of gate spacers GS may be on opposite sidewalls of each of the gate electrodes GE. The gate spacers GS may extend in the first direction D1 along the gate electrodes GE. In an implementation, the gate spacers GS may have top surfaces higher than those of the gate electrodes GE. The top surfaces of the gate spacers GS may be coplanar with that of a first interlayer dielectric layer 110 which will be discussed below. The gate spacers GS may have top surfaces substantially the same as those of the gate electrodes GE. The gate spacers GS may include, e.g., SiCN, SiCON, or SiN. In an implementation, the gate spacers GS may each include a multiple layer formed of at least two of SiCN, SiCON, and SiN.

A gate capping pattern GP may be on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. In an implementation, the gate capping pattern GP may include, e.g., SiON, SiCN, SiCON, or SiN. In an implementation, the gate capping pattern GP may be omitted on the gate electrode GE.

A gate dielectric layer GI may be between the gate electrode GE and the first active pattern AP1 and between the gate electrode GE and the second active pattern AP2. The gate dielectric layer GI may include an interfacial layer IL and a high-k dielectric layer HK on the interfacial layer IL. The interfacial layer IL may extend along a bottom surface of the gate electrode GE. The interfacial layer IL may cover the first top surface TS1 and the first sidewall SW1 of the first channel pattern CH1. The interfacial layer IL may cover the second top surface TS2 and the second sidewall SW2 of the second channel pattern CH2. The interfacial layer IL may cover a top surface of the device isolation layer ST that underlies the gate electrode GE.

The high-k dielectric layer HK may extend along the bottom surface of the gate electrode GE. In an implementation, the high-k dielectric layer HK may extend along the first top surface TS1 and the first sidewall SW1 of the first channel pattern CH1. The high-k dielectric layer HK may extend along the second top surface TS2 and the second sidewall SW2 of the second channel pattern CH2. The high-k dielectric layer HK may extend along the device isolation layer ST that underlies the gate electrode GE. The high-k dielectric layer HK may cover a top surface and a sidewall of the interfacial layer IL. The interfacial layer IL and the high-k dielectric layer HK may be conformally formed.

In an implementation, the high-k dielectric layer HK may include a high-k dielectric material whose dielectric constant is greater than that of a silicon oxide layer. In an implementation, the high-k dielectric material may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. In an implementation, the high-k dielectric layer HK may further include lanthanum (La) in the high-k dielectric material.

A first interlayer dielectric layer 110 may be on the substrate 100. The first interlayer dielectric layer 110 may cover the gate spacers GS and the first and second source/drain patterns SD1 and SD2. In an implementation, the first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. A third interlayer dielectric layer 130 may be on the second interlayer dielectric layer 120. A fourth interlayer dielectric layer 140 may be on the third interlayer dielectric layer 130. In an implementation, the first to fourth interlayer dielectric layers 110 to 140 may include a silicon oxide layer.

The logic cell LC may have opposite sides that face each other in the second direction D2, and a pair of separation structures DB may be on the opposite sides of the logic cell LC. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may separate the PMOSFET and NMOSFET regions PR and NR of the logic cell LC from an active region of an adjacent logic cell.

Active contacts AC may penetrate the first and second interlayer dielectric layers 110 and 120 and correspondingly electrically connect to the first and second source/drain patterns SD1 and SD2. Each of the active contacts AC may be between a pair of gate electrodes GE.

The active contact AC may be a self-aligned contact. In an implementation, the gate capping pattern GP or the gate spacer GS may be used to form the active contact AC in a self-alignment manner. In an implementation, the active contact AC may cover at least a portion of a sidewall of the gate spacer GS. In an implementation, the active contact AC may cover a portion of the top surface of the gate capping pattern GP.

A silicide pattern SC may be between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include a metal silicide, e.g., titanium silicide, tantalum silicide, tungsten silicide, nickel silicide, or cobalt silicide.

A gate contact GC may penetrate the second interlayer dielectric layer 120 and the gate capping pattern GP and to connect with the gate electrode GE. When viewed in plan, the gate contact GC may be provided between the PMOSFET region PR and the NMOSFET region NR. The gate contact GC may have a bottom surface in contact with the top surface of the gate electrode GE. The gate contact GC may have a top surface coplanar with that of the second interlayer dielectric layer 120.

Each of the active contact AC and the gate contact GC may include a conductive pattern FM and a barrier pattern BM that surrounds the conductive pattern FM. In an implementation, the conductive pattern FM may include, e.g., aluminum, copper, tungsten, molybdenum, or cobalt. The barrier pattern BM may cover sidewalls and a bottom surface of the conductive pattern FM. The barrier pattern BM may include a metal layer and a metal nitride layer. The metal layer may include, e.g., titanium, tantalum, tungsten, nickel, cobalt, or platinum. The metal nitride layer may include, e.g., a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be in the third interlayer dielectric layer 130. The first metal layer M1 may include first lower lines LIL1, second lower lines LIL2, and first vias VI1. The first vias VI1 may be below the first and second lower lines LIL1 and LIL2.

The first lower lines LIL1 may run across the logic cell LC and extend in the second direction D2. The first lower lines LIL1 may be power lines. In an implementation, the first lower line LIL1 may be supplied with a drain voltage VDD or a source voltage VSS.

Referring to FIG. 1, the logic cell LC may include a first cell boundary CB1 that extends in the second direction D2. On the logic cell LC, a second cell boundary CB2 may be defined on a location opposite to that on which the first cell boundary CB1 is defined. The first cell boundary CB1 may be provided thereon with the first lower line LIL1 to which is applied the drain voltage VDD, or a power voltage. The first lower line LIL1 to which the drain voltage VDD is applied may extend in the second direction D2 along the first cell boundary CB1. The second cell boundary CB2 may be provided thereon with the first lower line LIL1 to which is applied the source voltage VSS, or a ground voltage. The first lower line LIL1 to which the source voltage VSS is applied may extend in the second direction D2 along the second cell boundary CB2.

The second lower lines LIL2 may be between the first lower line LIL1 to which the drain voltage VDD is applied and the first lower line LIL1 to which the source voltage VSS is applied. The second lower lines LIL2 may extend in parallel to each other along the second direction D2. When viewed in plan, the second lower lines LIL2 may each have a linear or bar shape. The second lower lines LIL2 may be arranged along the first direction D1 at a second pitch. The second pitch may be less than the first pitch.

The first vias VI1 may be between the active contacts AC and the first and second lower lines LIL1 and LIL2. The first vias VI1 may be between the second lower lines LIL2 and the gate contacts GC. The first and second lower lines LIL1 and LIL2 may be in an upper portion of the third interlayer dielectric layer 130, and the first vias VI1 may be in a lower portion of the third interlayer dielectric layer 130. In an implementation, a dual damascene process may be used to form the first and second lower lines LIL1 and LIL2 and the first vias VI1.

A second metal layer M2 may be in the fourth interlayer dielectric layer 140. The second metal layer M2 may include upper lines UIL and second vias VI2.

The upper lines UIL may extend in parallel to each other in the first direction D1. When viewed in plan, the upper lines UIL may each have a linear or bar shape. The upper lines UIL may be arranged along the second direction D2.

The upper lines UIL may be in an upper portion of the fourth interlayer dielectric layer 140 and may extend in the first direction D1. The second vias VI2 may be in a lower portion of the fourth interlayer dielectric layer 140 and may be between the upper lines UIL and the first metal layer M1. The second vias VI2 may connect the upper lines UIL to the first metal layer M1. In an implementation, a dual damascene process may be employed to form the upper lines UIL and the second vias VI2.

Figure 2A:
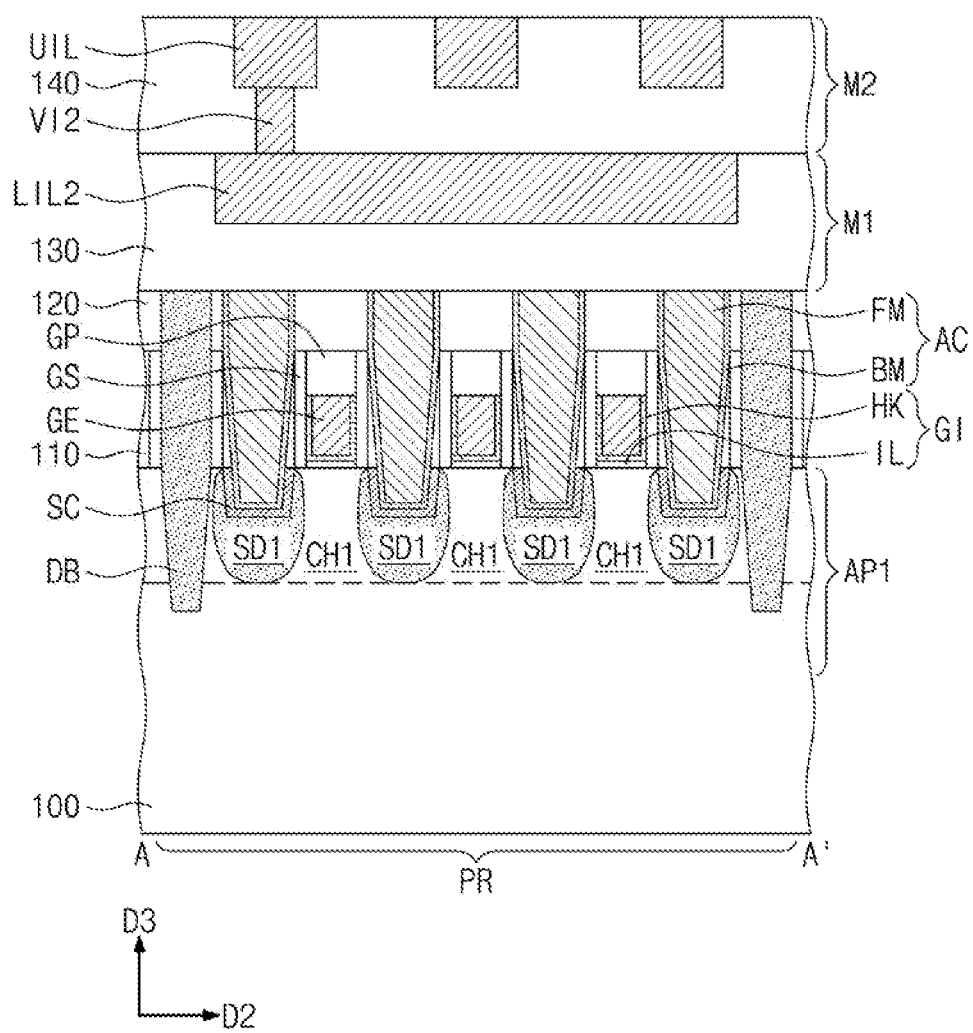
FIGS. 2A, 2B, 2C, and 2D illustrate cross-sectional views respectively taken along lines A-A', B-B', C-C', and D-D' of FIG. 1.
Figure 2B:
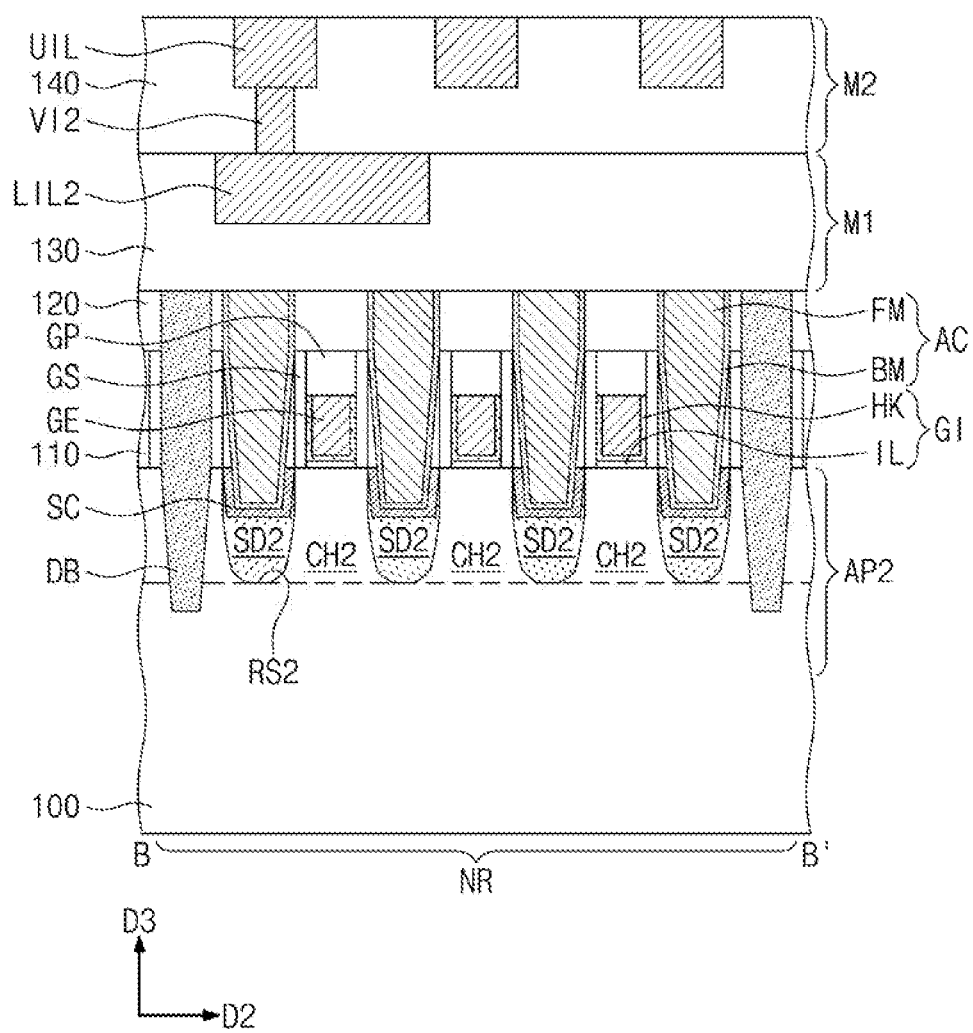
Figure 2C:
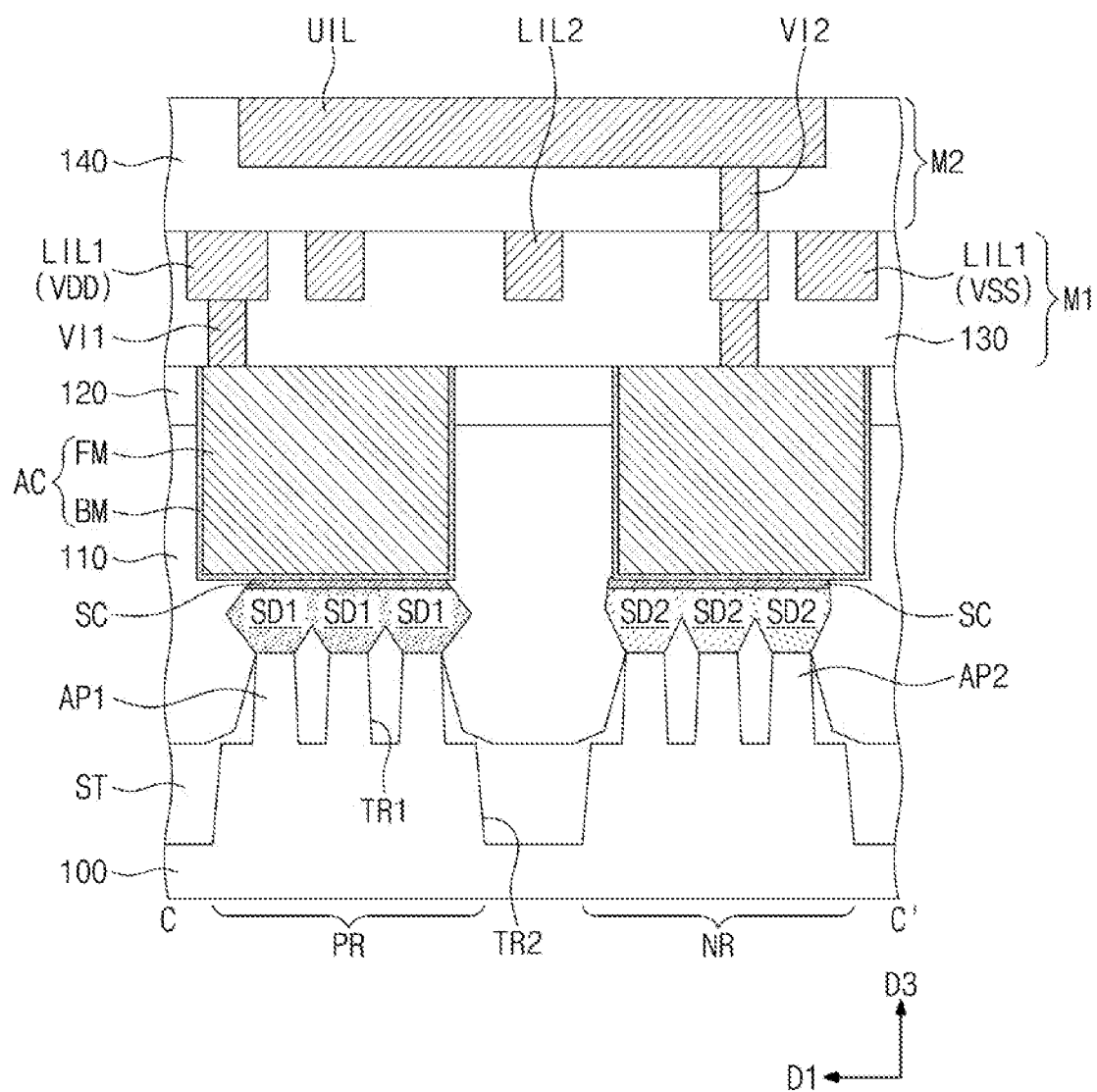
Figure 2D:
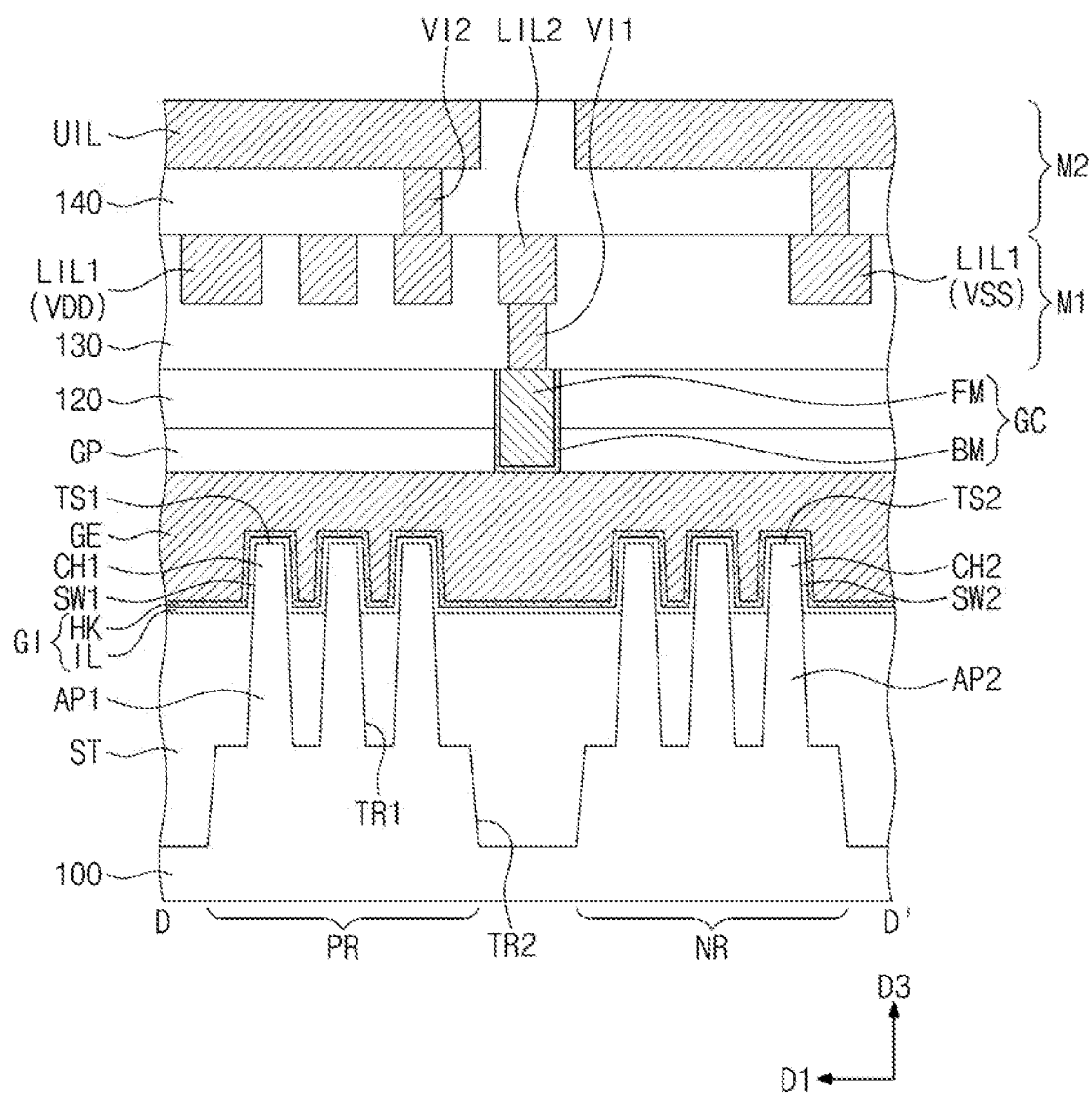
Figure 3:
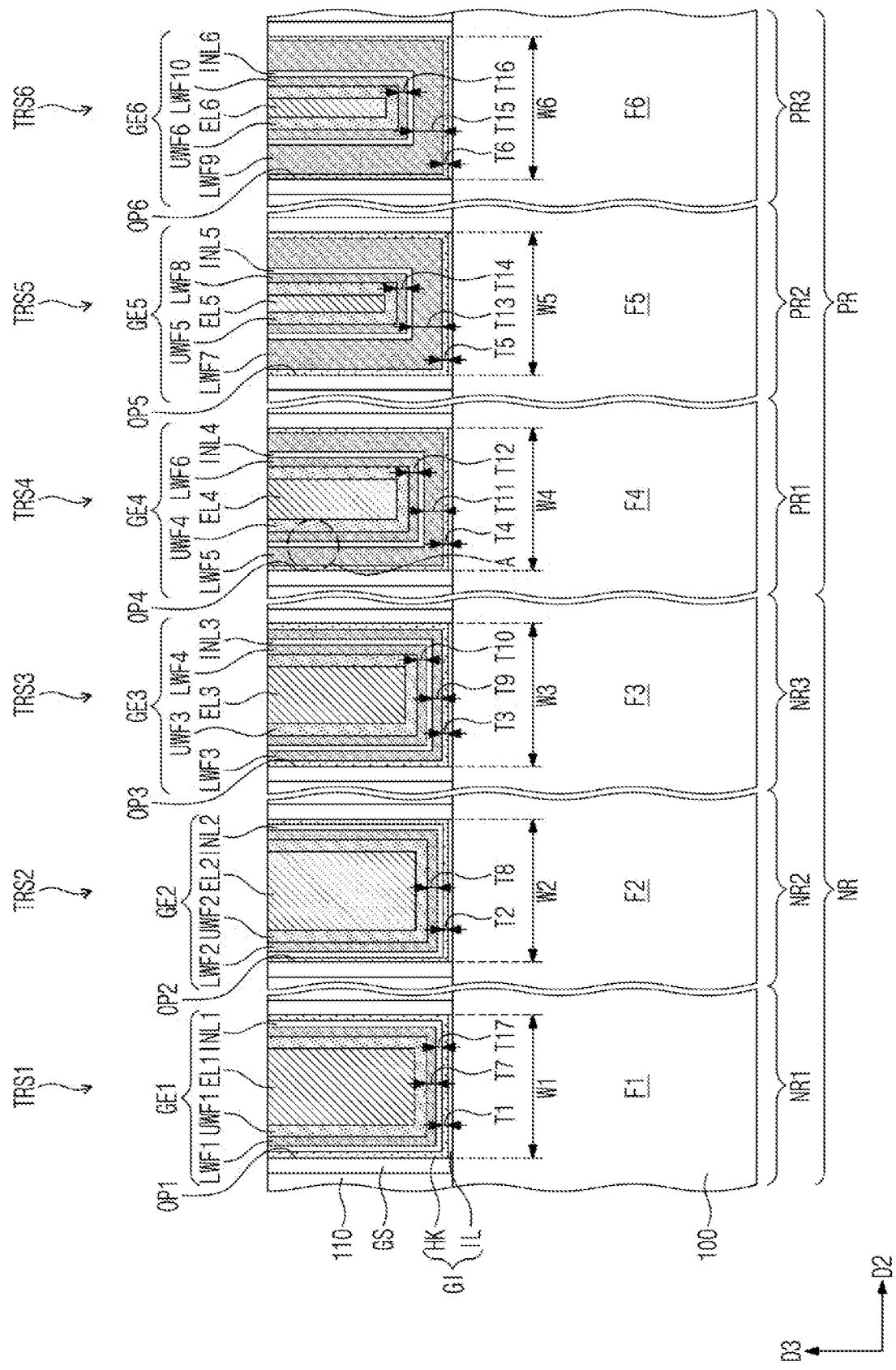
FIG. 3 illustrates an enlarged cross-sectional view of gate electrodes depicted in FIGS. 2A and 2B, showing a semiconductor device according to some embodiments.
Figure 4:
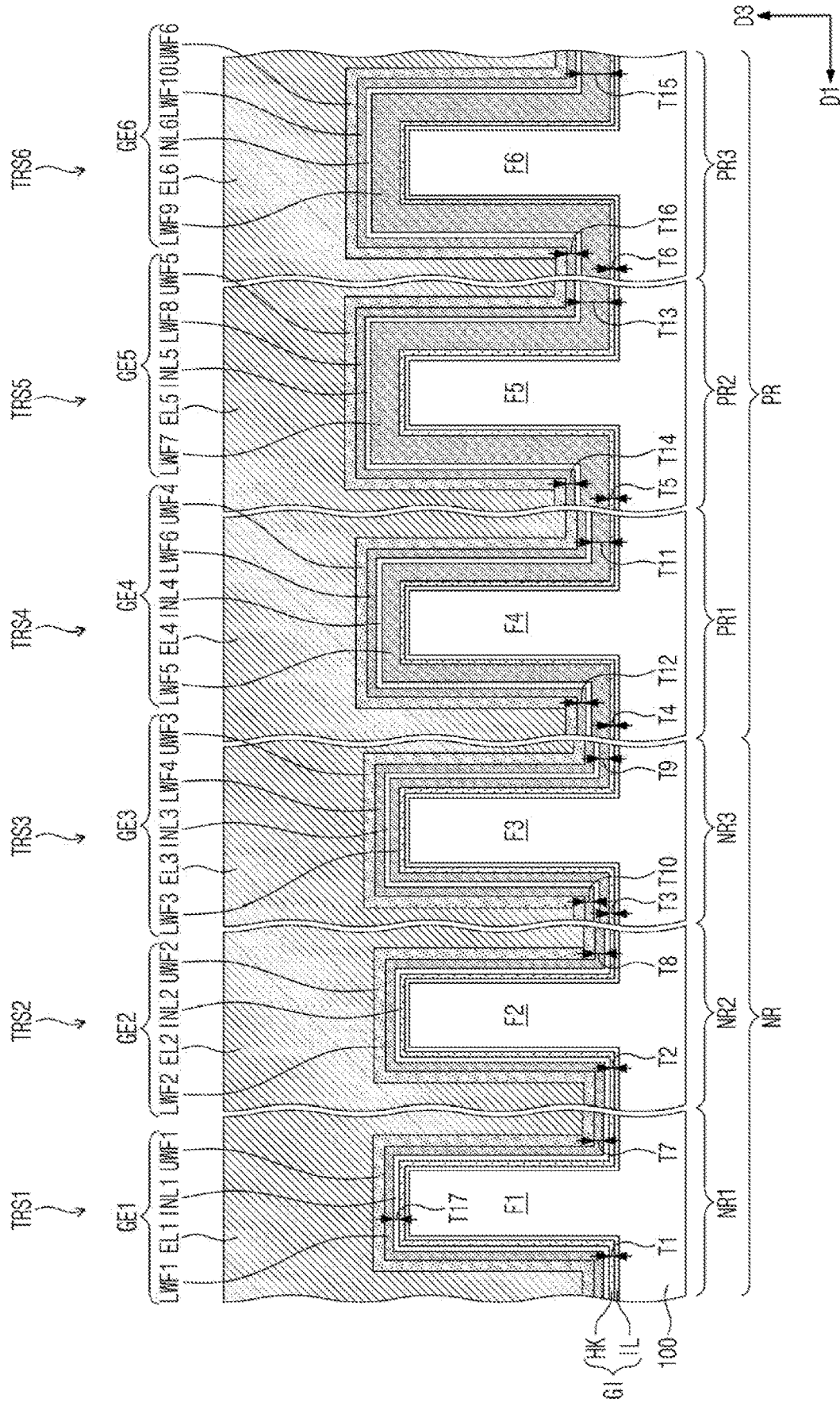
FIG. 4 illustrates an enlarged plan view of active patterns depicted in FIG. 2D, showing a semiconductor device according to some embodiments.
Figure 5:
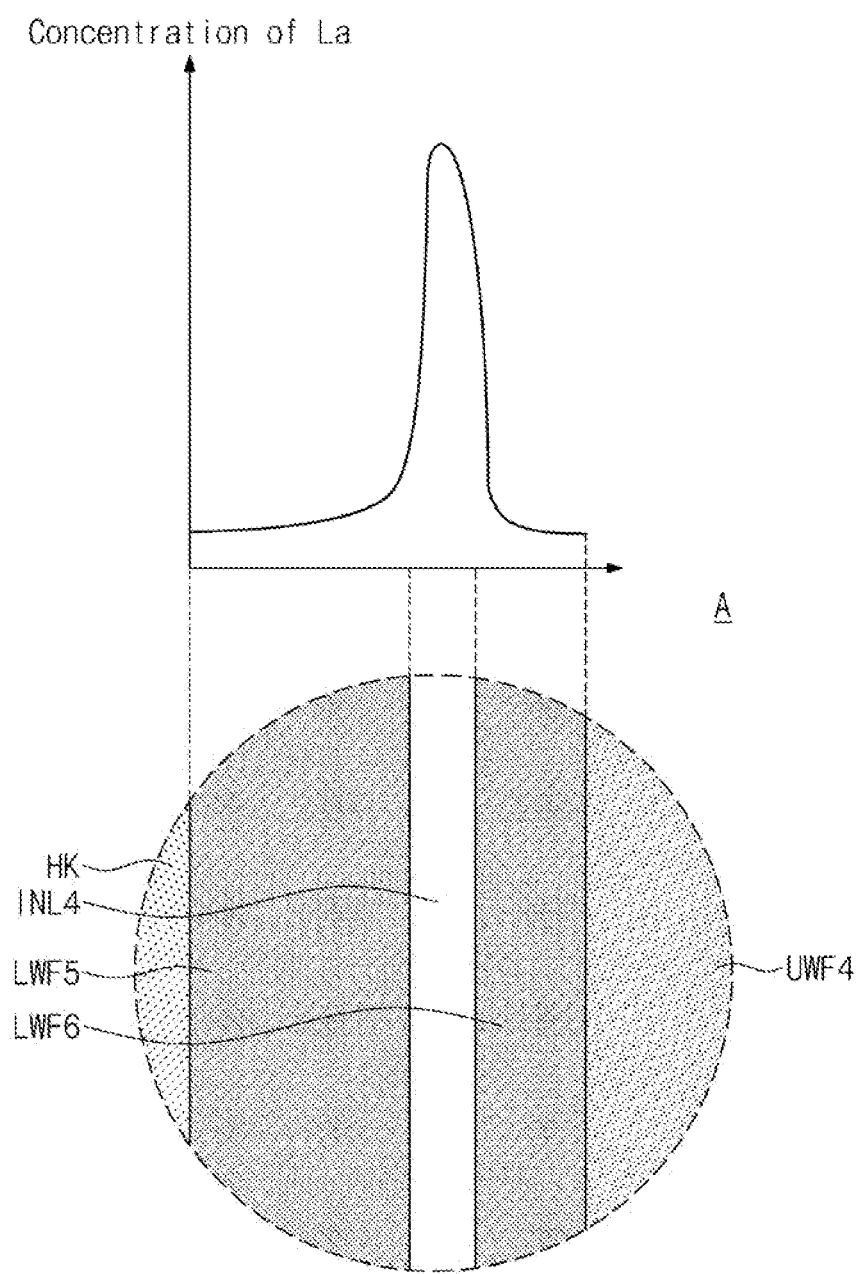
FIG. 5 illustrates an enlarged cross-sectional view showing section A of FIG. 3.

FIG. 3 illustrates an enlarged cross-sectional view of gate electrodes depicted in FIGS. 2A and 2B, showing a semiconductor device according to some embodiments. FIG. 4 illustrates an enlarged plan view of active patterns depicted in FIG. 2D, showing a semiconductor device according to some embodiments. FIG. 5 illustrates an enlarged cross-sectional view showing section A of FIG. 3.

Referring to FIGS. 3 and 4, a substrate 100 may include an NMOSFET region NR and a PMOSFET region PR. The NMOSFET region NR may include a first NMOSFET region NR1, a second NMOSFET region NR2, and a third NMOSFET region NR3. The PMOSFET region PR may include a first PMOSFET region PR1, a second PMOSFET region PR2, and a third PMOSFET region PR3.

The NMOSFET region NR may be provided thereon with first to third transistors TRS1 to TRS3 whose threshold voltages are different from each other. The PMOSFET region PR may be provided thereon with fourth to sixth transistors TRS4 to TRS6 whose threshold voltages are different from each other. The first transistor TRS1 may be on the first NMOSFET region NR1. The second transistor TRS2 may be on the second NMOSFET region NR2. The third transistor TRS3 may be on the third NMOSFET region NR3. The fourth transistor TRS4 may be on the first PMOSFET region PR1. The fifth transistor TRS5 may be on the second PMOSFET region PR2. The sixth transistor TRS6 may be on the third PMOSFET region PR3.

The first to sixth transistors TRS1 to TRS6 may include respective first to sixth active fins F1 to F6 and respective first to sixth openings OP1 to OP6. Each of the first to sixth transistors TRS1 to TRS6 may include a gate dielectric layer GI. The gate dielectric layer GI may include an interfacial layer IL and a high-k dielectric layer HK on the interfacial layer IL.

The first active fin F1 may be on the first NMOSFET region NR1. The second active fin F2 may be on the second NMOSFET region NR2. The third active fin F3 may be on the third NMOSFET region NR3. The fourth active fin F4 may be on the first PMOSFET region PR1. The fifth active fin F5 may be on the second PMOSFET region PR2. The sixth active fin F6 may be on the third PMOSFET region PR3. The first, second, and third active fins F1, F2, and F3 may be portions of the second active patterns AP2 discussed with reference to FIGS. 1 and 2A to 2D. The fourth, fifth, and sixth active fins F4, F5, and F6 may be portions of the first active patterns AP1 discussed with reference to FIGS. 1 and 2A to 2D.

The first to sixth openings OP1 to OP6 may be in the first interlayer dielectric layer 110. Each of the first to sixth openings OP1 to OP6 may extend in the first direction D1. The first to sixth openings OP1 to OP6 may be defined by gate spacers GS. The first to sixth openings OP1 to OP6 may have respective first to sixth widths W1 to W6 in the second direction D2. The first to sixth widths W1 to W6 may be substantially the same as each other.

The interfacial layer IL may be in each of the first to sixth openings OP1 to OP6. The interfacial layer IL may cover a bottom surface of each of the first to sixth openings OP1 to OP6 and may expose a sidewall of each of the first to sixth openings OP1 to OP6. In an implementation, the interfacial layer IL may be formed by using an ultraviolet oxidation process or a dual plasma oxidation process. The interfacial layer IL may conformally cover a top surface and a sidewall of each of the first to sixth active fins F1 to F6.

The high-k dielectric layer HK may be on the bottom surface and the sidewall of each of the first to sixth openings OP1 to OP6. The high-k dielectric layer HK may conformally cover a top surface of the interfacial layer IL and the sidewall of each of the sixth to sixth openings OP1 to OP6. The high-k dielectric layer HK may be conformally on the top surface and a sidewall of the interfacial layer IL. The high-k dielectric layer HK may be formed using one of chemical vapor deposition (CVD) and atomic layer deposition (ALD). The interfacial layer IL and the high-k dielectric layer HK may constitute the gate dielectric layer GI.

A first thickness T1 may be given as a thickness of the high-k dielectric layer HK in the first opening OP1 (e.g., in the vertical or third direction D3). A second thickness T2 may be given as a thickness of the high-k dielectric layer HK in the second opening OP2. A third thickness T3 may be given as a thickness of the high-k dielectric layer HK in the third opening OP3. A fourth thickness T4 may be given as a thickness of the high-k dielectric layer HK in the fourth opening OP4. A fifth thickness T5 may be given as a thickness of the high-k dielectric layer HK in the fifth opening OP5. A sixth thickness T6 may be given as a thickness of the high-k dielectric layer HK in the sixth opening OP6.

The first thickness T1 may be substantially the same as the third thickness T3 and the fifth thickness T5. The second thickness T2 may be substantially the same as the fourth thickness T4 and the sixth thickness T6. The first thickness T1 may be greater than the second thickness T2.

Lanthanum (La) may be included in the high-k dielectric layer HK in the first opening OP1, the high-k dielectric layer HK in the third opening OP3, and the high-k dielectric layer HK in the fifth opening OP5. No lanthanum (La) may be included in the high-k dielectric layer HK in the second opening OP2, the high-k dielectric layer HK in the fourth opening OP4, and the high-k dielectric layer HK in the sixth opening OP6.

The high-k dielectric layers HK in the first, third, and fifth openings OP1, OP3, and OP5 may have their lanthanum concentrations that are substantially the same as each other. The lanthanum concentration of the high-k dielectric layer HK in the first opening OP1 may be greater than those of the high-k dielectric layers HK in the second, fourth, and sixth openings OP2, OP4, and OP6.

The second transistor TRS2 may have a threshold voltage greater than that of the first transistor TRS1. The third transistor TRS3 may have a threshold voltage greater than that of the second transistor TRS2. The fourth transistor TRS4 may have a threshold voltage greater than that of the fifth transistor TRS5. The threshold voltage of the fifth transistor TRS5 may be greater than that of the sixth transistor TRS6.

The first to sixth transistors TRS1 to TRS6 may include respective first to sixth gate electrodes GE1 to GE6. The first to sixth gate electrodes GE1 to GE6 may be respectively in the first to sixth openings OP1 to OP6. Each of the first to sixth gate electrodes GE1 to GE6 may be on the gate dielectric layer GI. Each of the first to sixth gate electrodes GE1 to GE6 may include an intermediate pattern INL, a lower metal pattern LWF, an upper metal pattern UWF, and an electrode pattern EL. The lower metal pattern LWF may be a lower work-function pattern, and the upper metal pattern UWF may be an upper work-function pattern.

The first gate electrode GE1 may include a first intermediate pattern INL1, a first lower metal pattern LWF1, a first upper metal pattern UWF1, and a first electrode pattern EL1 that are sequentially stacked. The first intermediate pattern INL1 may be conformally on the high-k dielectric layer HK. The first intermediate pattern INL1 may extend along the bottom surface and the sidewall of the first opening OP1. The first intermediate pattern INL1 may be formed by using a chemical vapor deposition (CVD) or an atomic layer deposition (ALD). The first intermediate pattern INL1 may include lanthanum oxide (LaO).

The first lower metal pattern LWF1 may be conformally on the first intermediate pattern INL1. The first lower metal pattern LWF1 may extend along the bottom surface and the sidewall of the first opening OP1. The first lower metal pattern LWF1 may be formed by using chemical vapor deposition (CVD) or atomic layer deposition (ALD). The first intermediate pattern INL1 may be between the first lower metal pattern LWF1 and the gate dielectric layer GI.

The first lower metal pattern LWF1 may include a binary metal nitride, e.g., titanium nitride (TiN) and tantalum nitride (TaN), or a ternary metal nitride, e.g., titanium aluminum nitride (TiAlN), tantalum aluminum nitride (TaAlN), titanium silicon nitride (TiSiN), or tantalum silicon nitride (TaSiN). In an implementation, the first lower metal pattern LWF1 may include, e.g., titanium nitride (TiN) or tantalum nitride (TaN).

The first upper metal pattern UWF1 may be conformally on the first lower metal pattern LWF1. The first upper metal pattern UWF1 may extend along the bottom surface and the sidewall of the first opening OP1. The first upper metal pattern UWF1 may be formed by using chemical vapor deposition (CVD) or atomic layer deposition (ALD).

The first upper metal pattern UWF1 may include, e.g., titanium aluminum carbide (TiAlC), titanium aluminum nitride (TiAlN), titanium aluminum carbonitride (TiAlCN), or titanium aluminum (TiAl). In an implementation, the first upper metal pattern UWF1 may include aluminum (Al).

The first electrode pattern EL1 may be on the first upper metal pattern UWF1. The first electrode pattern EL1 may fill an unoccupied (e.g., remaining) portion of the first opening OP1. In an implementation, the first electrode pattern EL1 may include, e.g., titanium nitride (TiN), tantalum nitride (TaN), or tungsten nitride (WN). In an implementation, the first electrode pattern EL1 may include a barrier pattern including, e.g., titanium nitride (TiN), tantalum nitride (TaN), or tungsten nitride (WN), and may also include a metal pattern on the barrier pattern and including, e.g., tungsten (W), aluminum (Al), titanium (Ti), or tantalum (Ta).

The second gate electrode GE2 may include a second intermediate pattern INL2, a second lower metal pattern LWF2, a second upper metal pattern UWF2, and a second electrode pattern EL2 that are sequentially stacked. The second gate electrode GE2 may have a structure and a material substantially the same as or similar to those of the first gate electrode GE1.

The third gate electrode GE3 may include a third lower metal pattern LWF3, a third intermediate pattern INL3, a fourth lower metal pattern LWF4, a third upper metal pattern UWF3, and a third electrode pattern EL3 that are sequentially stacked. The third lower metal pattern LWF3 may be conformally on the high-k dielectric layer HK. The third lower metal pattern LWF3 may extend along the bottom surface and the sidewall of the third opening OP3. The third lower metal pattern LWF3 may be formed using chemical vapor deposition (CVD) or atomic layer deposition (ALD). The third lower metal pattern LWF3 may include a binary metal nitride, e.g., titanium nitride (TiN) or tantalum nitride (TaN), or a ternary metal nitride, e.g., titanium aluminum nitride (TiAlN), tantalum aluminum nitride (TaAlN), titanium silicon nitride (TiSiN), or tantalum silicon nitride (TaSiN). In an implementation, the third lower metal pattern LWF3 may include, e.g., titanium nitride (TiN) or tantalum nitride (TaN).

The third intermediate pattern INL3 may be conformally on the third lower metal pattern LWF3. The third intermediate pattern INL3 may extend along the bottom surface and the sidewall of the third opening OP3. The third intermediate pattern INL3 may be formed using chemical vapor deposition (CVD) or atomic layer deposition (ALD). The third intermediate pattern INL3 may include lanthanum oxide (LaO).

The fourth lower metal pattern LWF4 may be conformally on the third intermediate pattern INL3. The fourth lower metal pattern LWF4 may extend along the bottom surface and the sidewall of the third opening OP3. The fourth lower metal pattern LWF4 may be formed using chemical vapor deposition (CVD) or atomic layer deposition (ALD). The fourth lower metal pattern LWF4 may include the same material as that of the third lower metal pattern LWF3. In an implementation, the fourth lower metal pattern LWF4 may include, e.g., titanium nitride (TiN) or tantalum nitride (TaN). The third intermediate pattern INL3 may be between the third and fourth lower metal patterns LWF3 and LWF4.

The third upper metal pattern UWF3 may be conformally on the fourth lower metal pattern LWF4. The third upper metal pattern UWF3 may extend along the bottom surface and the sidewall of the third opening OP3. The third upper metal pattern UWF3 may be formed using chemical vapor deposition (CVD) or atomic layer deposition (ALD).

The third upper metal pattern UWF3 may include, e.g., titanium aluminum carbide (TiAlC), titanium aluminum nitride (TiAlN), titanium aluminum carbonitride (TiAlCN), or titanium aluminum (TiAl). In an implementation, the third upper metal pattern UWF3 may include aluminum (Al).

The third electrode pattern EL3 may be on the third upper metal pattern UWF3. The third electrode pattern EL3 may fill an unoccupied portion of the third opening OP3. In an implementation, the third electrode pattern EL3 may include, e.g., titanium nitride (TiN), tantalum nitride (TaN), or tungsten nitride (WN). In an implementation, the third electrode pattern EL3 may include a barrier pattern including, e.g., titanium nitride (TiN), tantalum nitride (TaN), or tungsten nitride (WN), and may also include a metal pattern on the barrier pattern and including, e.g., tungsten (W), aluminum (Al), titanium (Ti), or tantalum (Ta).

The fourth gate electrode GE4 may include a fifth lower metal pattern LWF5, a fourth intermediate pattern INL4, a sixth lower metal pattern LWF6, a fourth upper metal pattern UWF4, and a fourth electrode pattern EL4 that are sequentially stacked. The fifth gate electrode GE5 may include a seventh lower metal pattern LWF7, a fifth intermediate pattern INL5, an eighth lower metal pattern LWF8, a fifth upper metal pattern UWF5, and a fifth electrode pattern EL5 that are sequentially stacked. The sixth gate electrode GE6 may include a ninth lower metal pattern LWF9, a sixth intermediate pattern INL6, a tenth lower metal pattern LWF10, a sixth upper metal pattern UWF6, and a sixth electrode pattern EL6 that are sequentially stacked. Each of the fourth, fifth, and sixth gate electrodes GE4, GE5, and GE6 may have a structure and a material substantially the same as or similar to those of the third gate electrode GE3.

The first electrode pattern EL1 may have a bottom surface whose maximum level or height (e.g., distance from the substrate 100 in the third direction D3) is higher than that of a bottom surface of the second electrode pattern EL2. The third electrode pattern EL3 may have a bottom surface whose maximum level is lower than that of a bottom surface of the fourth electrode pattern EL4. The maximum level of the bottom surface of the first electrode pattern EL1 may be lower than that of the bottom surface of the third electrode pattern EL3. The fifth electrode pattern EL5 may have a bottom surface whose maximum level is higher than that of a bottom surface of the sixth electrode pattern EL6. The maximum level of the bottom surface of the sixth electrode pattern EL6 may be higher than that of the bottom surface of the fourth electrode pattern EL4.

The first electrode pattern EL1 may have a width in the second direction D2 less than a width in the second direction D2 of the second electrode pattern EL2. The third electrode pattern EL3 may have a width in the second direction D2 greater than a width in the second direction D2 of the fourth electrode pattern EL4. The width in the second direction D2 of the first electrode pattern EL1 may be greater than the width in the second direction D2 of the third electrode pattern EL3. The fifth electrode pattern EL5 may have a width in the second direction D2 less than a width in the second direction D2 of the sixth electrode pattern EL6. The width in the second direction D2 of the sixth electrode pattern EL6 may be less than the width in the second direction D2 of the fourth electrode pattern EL4.

The first to tenth lower metal patterns LWF1 to LWF10 may have respective seventh to sixteenth thicknesses T7 to T16. The seventh thickness T7 may be substantially the same as the eighth thickness T8, the ninth thickness T9, the tenth thickness T10, the twelfth thickness T12, the fourteenth thickness T14, and the sixteenth thickness T16. The eleventh thickness T11 may be greater than the seventh thickness T7. The thirteenth thickness T13 may be greater than the eleventh thickness T11. The fifteenth thickness T15 may be substantially the same as the thirteenth thickness T13. A thickness of each of the lower metal patterns LWF may be adjusted to control a threshold voltage of a corresponding one of the transistors TRS.

The first to sixth upper metal patterns UWF1 to UWF6 may have substantially the same thickness. A thickness of each of the upper metal patterns UWF may be adjusted to control a threshold voltage of a corresponding one of the transistors TRS.

A seventeenth thickness T17 may be given as a thickness of each of the first to sixth intermediate patterns INL1 to INL6. In an implementation, the first to sixth intermediate patterns INL1 to INL6 may have substantially the same thickness. The seventeenth thickness T17 may be less than the seventh thickness T7. The intermediate patterns INL may have their thicknesses each of which is less than that of each of the lower metal patterns LWF. For example, a ratio of the seventeenth thickness T17 to the seventh thickness T7 may range from about $1/25$ to about $1/2$.

The gate electrodes GE may each include the intermediate pattern INL including lanthanum oxide (LaO). Even when the intermediate pattern INL is between the lower metal patterns LWF, the intermediate pattern INL may have a thickness much less than that of the lower metal patterns LWF, and the gate electrode GE may serve as an electrode through which a current flows. The presence of the intermediate pattern INL may help effectively prevent a leakage current to the gate electrode GE. In conclusion, a semiconductor device may increase or improve in electrical properties.

Referring to FIG. 5, as regards the fourth transistor TRS4, the fifth lower metal pattern LWF5 may have a lanthanum concentration that gradually decreases with increasing distance from the fourth upper metal pattern UWF4. In an implementation, the lanthanum concentration of the fifth lower metal pattern LWF5 may progressively increase in a direction from the high-k dielectric layer HK toward the fourth intermediate pattern INL4.

The sixth lower metal pattern LWF6 may have a lanthanum concentration that gradually increases with increasing distance from the fourth upper metal pattern UWF4. In an implementation, the lanthanum concentration of the sixth lower metal pattern LWF6 may progressively decrease in a direction from the fourth intermediate pattern INL4 toward the fourth upper metal pattern UWF4. In an implementation, as illustrated in FIG. 5, distinct boundaries or interfaces may be present between the fourth intermediate pattern INL4 and the fifth and sixth lower metal patterns LWF5 and LWF6, or a small thickness of the fourth intermediate pattern INL4 may induce the absence of the distinct boundaries between the fourth intermediate pattern INL4 and the fifth and sixth lower metal patterns LWF5 and LWF6.

With regard to the third transistor TRS3, the fifth transistor TRS5, and the sixth transistor TRS6, a lanthanum concentration profile of FIG. 5 may be provided to the lower metal patterns LWF in the gate electrode GE in which the intermediate pattern INL is interposed between the lower metal patterns LWF.

Figure 6A:
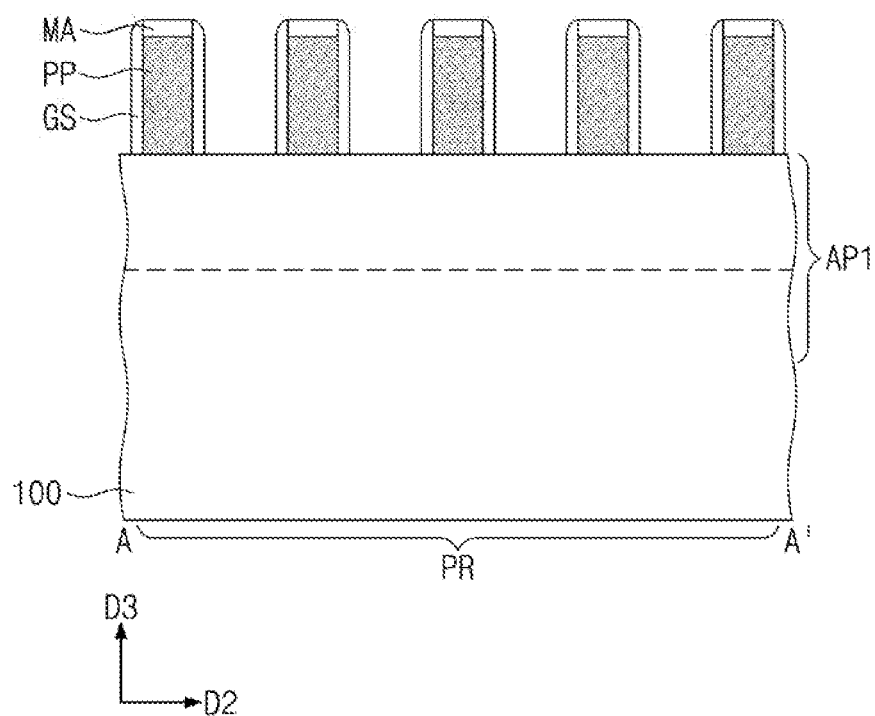
FIGS. 6A to 8D illustrate cross-sectional views of stages in a method of fabricating a semiconductor device according to some embodiments.
Figure 8A:
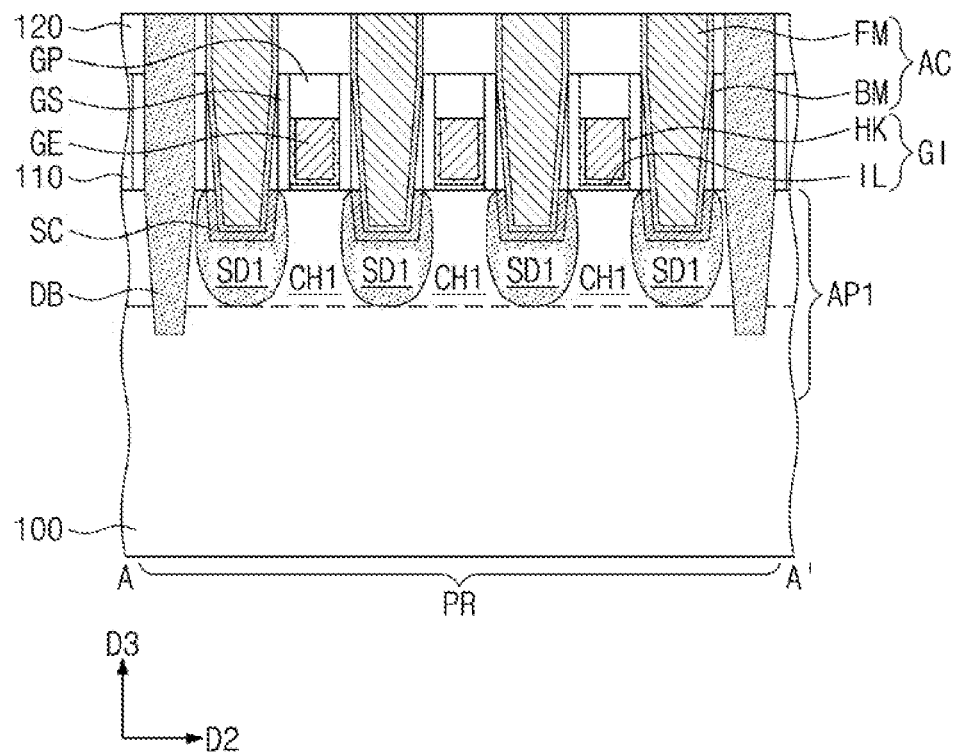
Figure 8B:
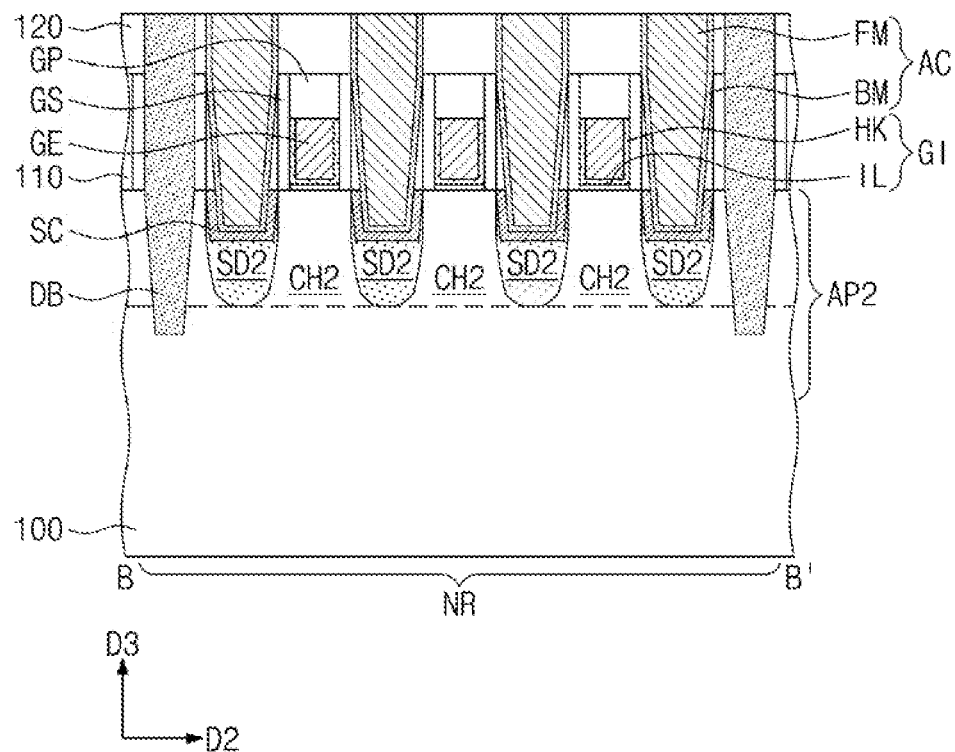
Figure 8C:
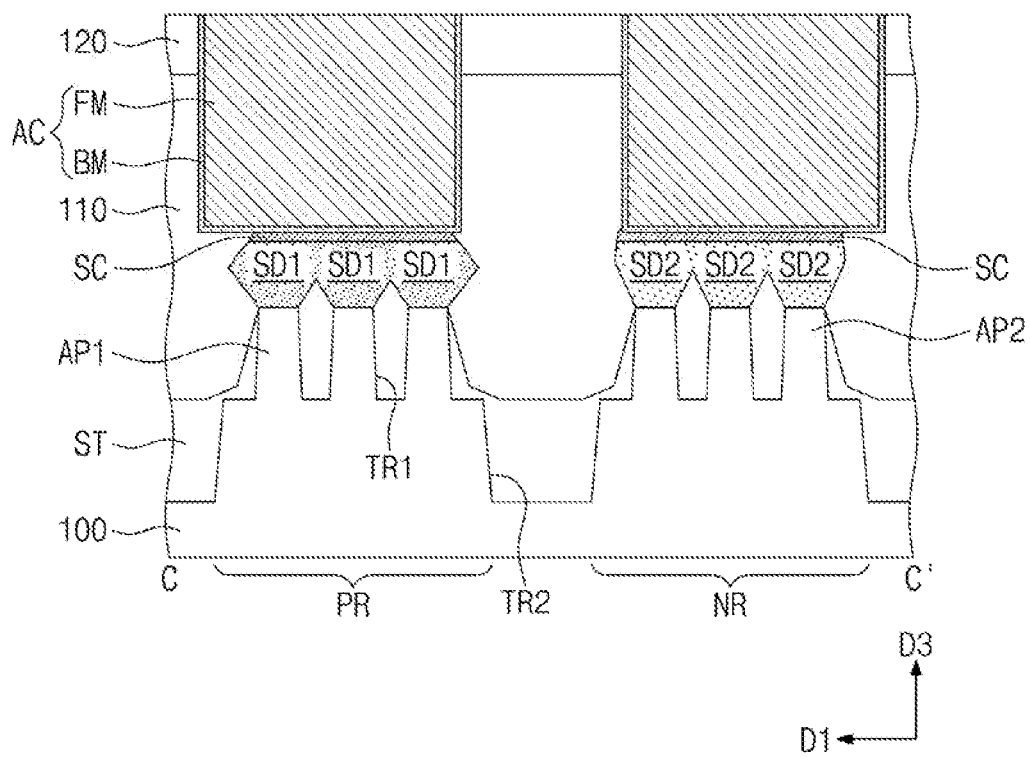
Figure 8D:
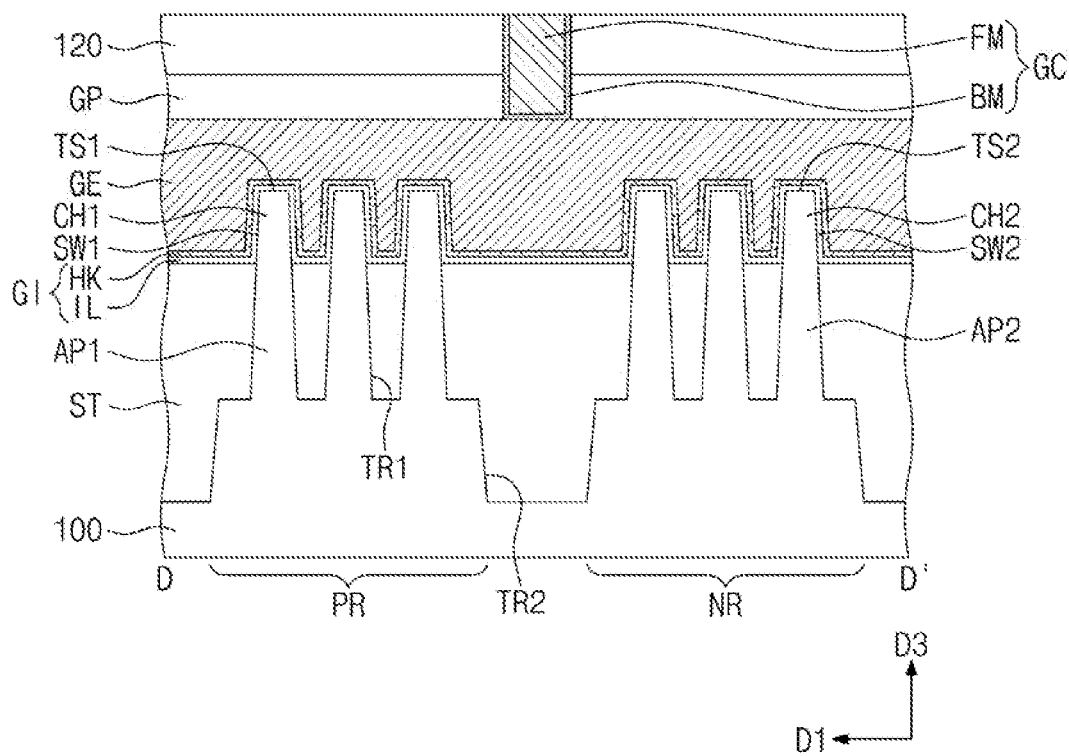

FIGS. 6A to 8D illustrate cross-sectional views of stages in a method of fabricating a semiconductor device according to some embodiments. FIGS. 6A, 7A, and 8A illustrate cross-sectional views taken along line A-A' of FIG. 1. FIGS. 7B and 8B illustrate cross-sectional views taken along line B-B' of FIG. 1. FIGS. 7C and 8C illustrate cross-sectional views taken along line C-C' of FIG. 1. FIGS. 6B, 7D, and 8D illustrate cross-sectional views taken along line D-D' of FIG. 1.

Figure 6B:
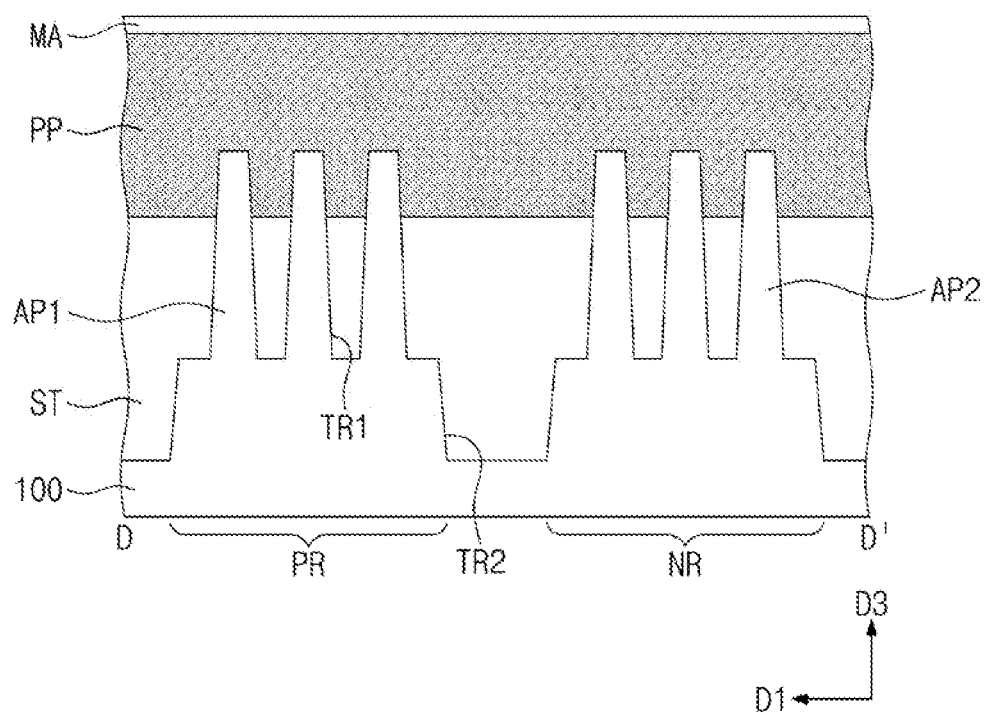
Figure 7A:
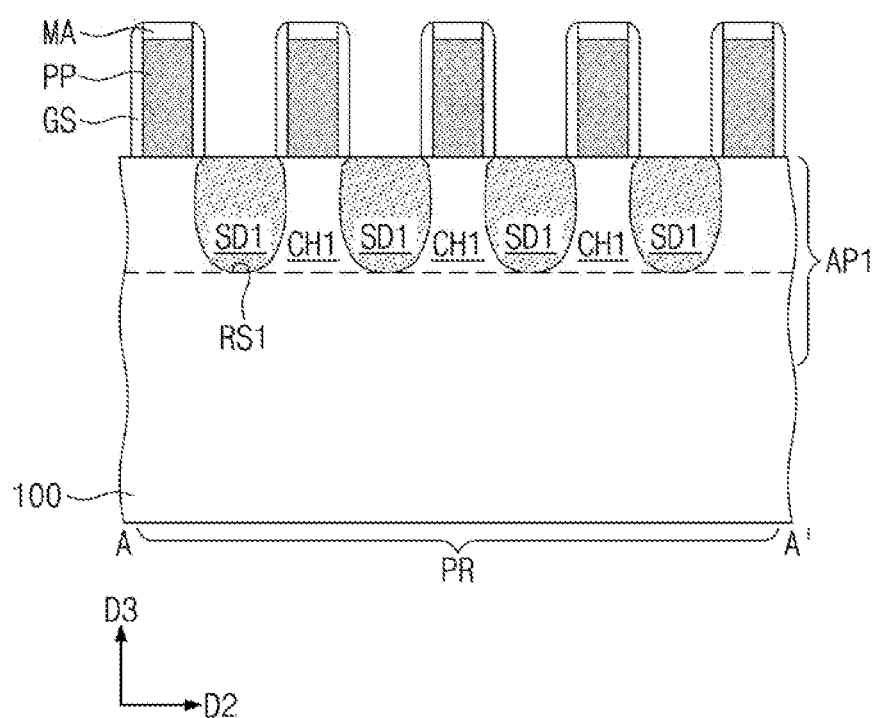
Figure 7B:
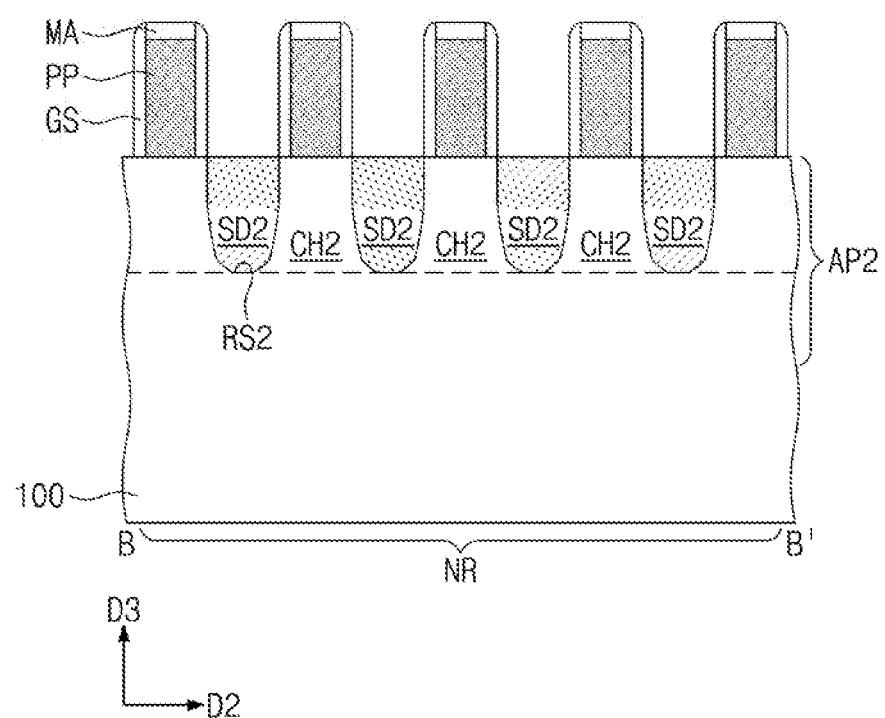
Figure 7C:
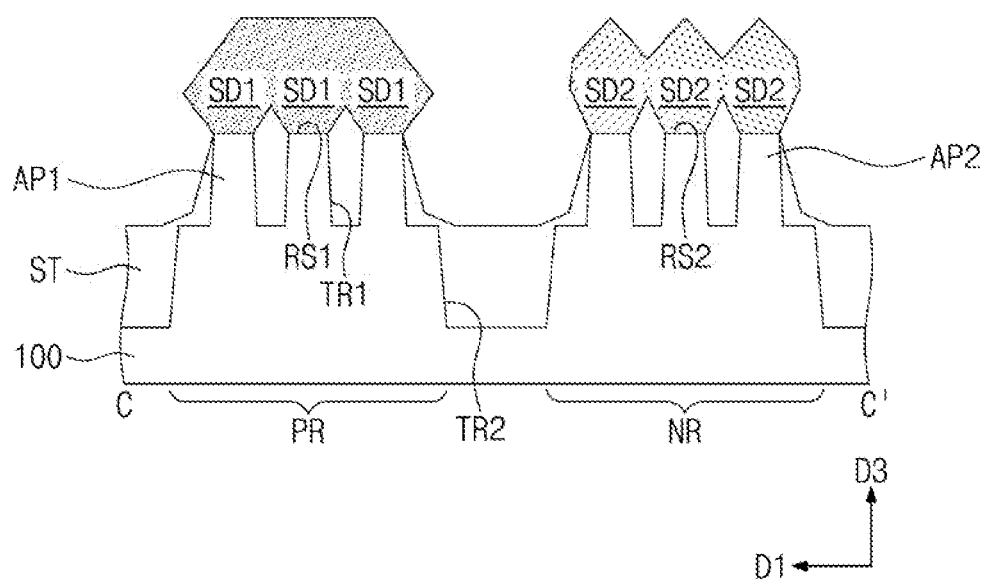
Figure 7D:
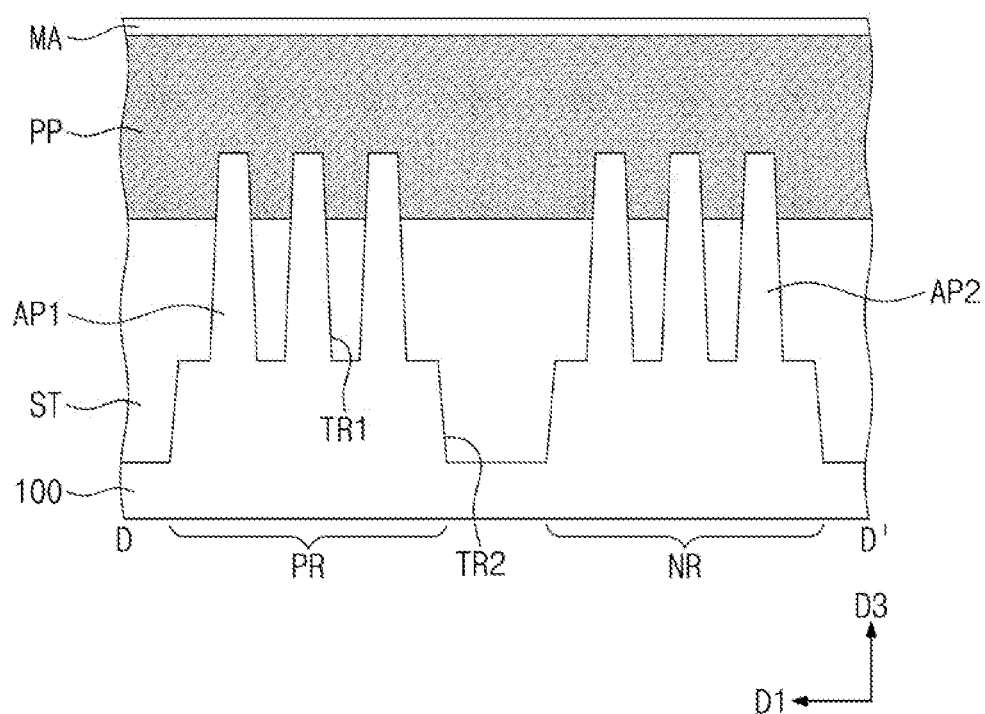

Referring to FIGS. 1, 6A, and 6B, a substrate 100 may be provided which includes a PMOSFET region PR and an NMOSFET region NR. The PMOSFET and NMOSFET regions PR and NR may define a logic cell LC on the substrate 100.

The substrate 100 may be patterned to form first and second active patterns AP1 and AP2. The first active patterns AP1 may be formed on the PMOSFET region PR, and the second active patterns AP2 may be formed on the NMOSFET region NR. A first trench TR1 may be formed between the first active patterns AP1 and between the second active patterns AP2. The substrate 100 may be patterned to form a second trench TR2 between the PMOSFET region PR and the NMOSFET region NR. The second trench TR2 may be formed deeper than the first trench TR1.

A device isolation layer ST may be formed on the substrate 100, filling the first and second trenches TR1 and TR2. The device isolation layer ST may include a dielectric material, e.g., a silicon oxide layer. The device isolation layer ST may be recessed until upper portions of the first and second active patterns AP1 and AP2 are exposed. Therefore, the first and second active patterns AP1 and AP2 may have their upper portions that vertically protrude upwards from the device isolation layer ST.

Sacrificial patterns PP may be formed to run across the first and second active patterns AP1 and AP2. Each of the sacrificial patterns PP may be formed to have a linear or bar shape that extends in a first direction D1. The sacrificial patterns PP may be arranged at a first pitch along a second direction D2.

In an implementation, the formation of the sacrificial patterns PP may include forming a sacrificial layer on an entire surface of the substrate 100, forming mask patterns MA on the sacrificial layer, and using the mask patterns MA as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include SiCN, SiCON, or SiN. In an implementation, the gate spacer layer may be a multiple layer including at least two of SiCN, SiCON, and SiN.

Referring to FIGS. 1 and 7A to 7D, first source/drain patterns SD1 may be formed on the upper portion of the first active pattern AP1. A pair of first source/drain patterns SD1 may be formed on opposite sides of each of the sacrificial patterns PP.

The mask patterns MA and the gate spacers GS may be used as an etching mask to etch the upper portion of the first active pattern AP1, thereby forming first recesses RS1. While the first active pattern AP1 is etched at its upper portion, the device isolation layer ST may be recessed between the first active patterns AP1 (see FIG. 7C).

A selective epitaxial growth process may be performed in which an inner wall of the first recess RS1 of the first active pattern AP1 is used as a seed layer to form the first source/drain pattern SD1. As the first source/drain patterns SD1 are formed, a first channel pattern CH1 may be defined between a pair of first source/drain patterns SD1. In an implementation, the selective epitaxial growth process may include chemical vapor deposition (CVD) or molecular beam epitaxy (MBE). The first source/drain patterns SD1 may include a semiconductor element (e.g., SiGe) whose lattice constant is greater than that of a semiconductor element of the substrate 100.

In an implementation, impurities may be in-situ implanted during the selective epitaxial growth process for forming the first source/drain patterns SD1. In an implementation, after the first source/drain patterns SD1 are formed, impurities may be implanted into the first source/drain patterns SD1. The first source/drain patterns SD1 may be doped to have a first conductivity type (e.g., p-type).

Second source/drain patterns SD2 may be formed on the upper portion of the second active pattern AP2. A pair of second source/drain patterns SD2 may be formed on opposite sides of each of the sacrificial patterns PP.

The mask patterns MA and the gate spacers GS may be used as an etching mask to etch the upper portion of the second active pattern AP2, thereby forming second recesses RS2. A selective epitaxial growth process may be performed in which an inner wall of the second recess RS2 of the second active pattern AP2 is used as a seed layer to form the second source/drain pattern SD2. As the second source/drain patterns SD2 are formed, a second channel pattern CH2 may be defined between a pair of second source/drain patterns SD2. In an implementation, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 1 and 8A to 8D, a first interlayer dielectric layer 110 may be formed to cover the first and second source/drain patterns SD1 and SD2, the mask patterns MA, and the gate spacers GS. In an implementation, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The mask patterns MA may all be removed during the planarization process. As a result, the first interlayer dielectric layer 110 may have a top surface coplanar with those of the sacrificial patterns PP and those of the gate spacers GS.

The sacrificial patterns PP may be replaced with corresponding gate electrodes GE. In an implementation, the exposed sacrificial patterns PP may be selectively removed. The removal of the sacrificial patterns PP may form openings. A gate dielectric layer GI, the gate electrode GE, and a gate capping pattern GP may be formed in each of the openings.

A second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and electrically connect to the first and second source/drain patterns SD1 and SD2. A gate contact GC may be formed to penetrate the second interlayer dielectric layer 120 and the gate capping pattern GP and to electrically connect to the gate electrode GE.

A pair of separation structures DB may be formed on opposite sides of the logic cell LC, which opposite sides face each other in the second direction D2. The separation structures DB may be formed to overlap the gate electrodes GE on the opposite sides of the logic cell LC. In an implementation, the formation of the separation structures DB may include forming holes that penetrate the first and second interlayer dielectric layers 110 and 120 and the gate electrode GE and to extend into the first and second active patterns AP1 and AP2, and then filling the holes with a dielectric layer.

Referring back to FIGS. 1 and 2A to 2D, a third interlayer dielectric layer 130 may be formed on the second interlayer dielectric layer 120. The third interlayer dielectric layer 130 may include a silicon oxide layer. A first metal layer M1 may be formed in the third interlayer dielectric layer 130. The first metal layer M1 may include lower lines LIL1 and LIL2 and first vias VI1. The lower lines LIL1 and LIL2 may extend in the second direction D2. In an implementation, a damascene process may be formed to form the lower lines LIL1 and LIL2. The first vias VI1 may be formed under the lower lines LIL1 and LIL2.

A fourth interlayer dielectric layer 140 may be formed on the third interlayer dielectric layer 130. The fourth interlayer dielectric layer 140 may include a silicon oxide layer. A second metal layer M2 may be formed in the fourth interlayer dielectric layer 140. The second metal layer M2 may include upper lines UIL and second vias VI2.

The upper lines UIL may extend in parallel to each other in the first direction D1. When viewed in plan, the upper lines UIL may each have a linear or bar shape. The upper lines UIL may be arranged along the second direction D2. In an implementation, a dual damascene process may be performed to form the upper lines UIL and the second vias VI2.

FIGS. 9A to 9G illustrate conceptual views of stages in a method of forming a gate dielectric layer and a gate electrode according to some embodiments. As illustrated in FIGS. 3 and 4, in order to form a gate dielectric layer and a gate electrode in an opening, a plurality of material layers may be sequentially stacked to conform to a shape of the opening. For convenience of illustration, each material layer will be shown as a flat plate. In addition, there may be an omission of a material layer that corresponds to the interfacial layer IL.

Figure 9A:
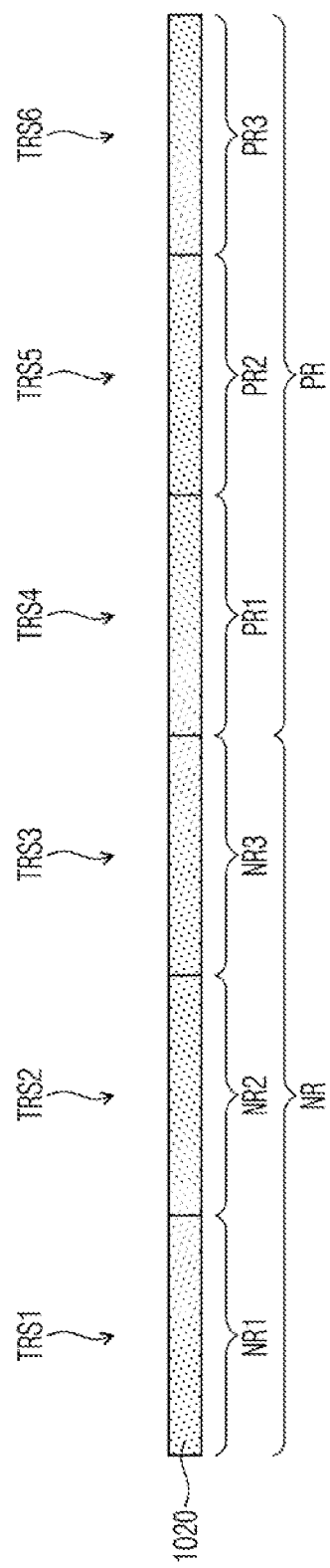
FIGS. 9A to 9G illustrate conceptual views of stages in a method of forming a gate dielectric layer and a gate electrode according to some embodiments.

Referring to FIG. 9A, an NMOSFET region NR and a PMOSFET region PR may be defined in a substrate. The NMOSFET region NR may include first, second, and third NMOSFET regions NR1, NR2, and NR3. The PMOSFET region PR may include first, second, and third PMOSFET regions PR1, PR2, and PR3. A first transistor TRS1 may be defined on the first NMOSFET region NR1. A second transistor TRS2 may be defined on the second NMOSFET region NR2. A third transistor TRS3 may be defined on the third NMOSFET region NR3. A fourth transistor TRS4 may be defined on the first PMOSFET region PR1. A fifth transistor TRS5 may be defined on the second PMOSFET region PR2. A sixth transistor TRS6 may be defined on the third PMOSFET region PR3.

A preliminary dielectric layer may be formed in the openings on the PMOSFET region PR and the NMOSFET region NR. The preliminary dielectric layer may be formed on the interfacial layer IL discussed with reference to FIGS. 3 and 4.

The preliminary dielectric layer may include a high-k dielectric layer. In an implementation, the preliminary dielectric layer may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. The preliminary dielectric layer may be formed using chemical vapor deposition (CVD) or atomic layer deposition (ALD).

A work-function adjustment element layer may be formed in the openings formed on the PMOSFET region PR and the NMOSFET region NR. In an implementation, the work-function adjustment element layer may include a work-function adjustment material, e.g., lanthanum (La) or lanthanum oxide (LaO). The work-function adjustment element layer may be formed using chemical vapor deposition (CVD) or atomic layer deposition (ALD). The work-function adjustment element layer may have a substantially uniform thickness. The work-function adjustment element layer may be selectively formed on the first NMOSFET region NR1, the third NMOSFET region NR3, and the second PMOSFET region PR2. In an implementation, the work-function adjustment element layer may be selectively formed on an area on which is defined the first transistor TRS1, the third transistor TRS3, or the fifth transistor TRS5.

Afterwards, an annealing process may be performed. The annealing process may facilitate diffusion of work-function adjustment elements or materials (e.g., lanthanum) into the preliminary dielectric layer on the first NMOSFET region NR1, the third NMOSFET region NR3, and the second PMOSFET region PR2. A preliminary high-k dielectric layer 1020 may be eventually formed. A thickness of the preliminary high-k dielectric layer 1020 on the first NMOSFET region NR1, the third NMOSFET region NR3, and the second PMOSFET region PR2 may be greater than a thickness of the preliminary high-k dielectric layer 1020 on the second NMOSFET region NR2, the first PMOSFET region PR1, and the third PMOSFET region PR3. A lanthanum concentration of the preliminary high-k dielectric layer 1020 on the first NMOSFET region NR1, the third NMOSFET region NR3, and the second PMOSFET region PR2 may be greater than a lanthanum concentration of the preliminary high-k dielectric layer 1020 on the second NMOSFET region NR2, the first PMOSFET region PR1, and the third PMOSFET region PR3.

Figure 9B:
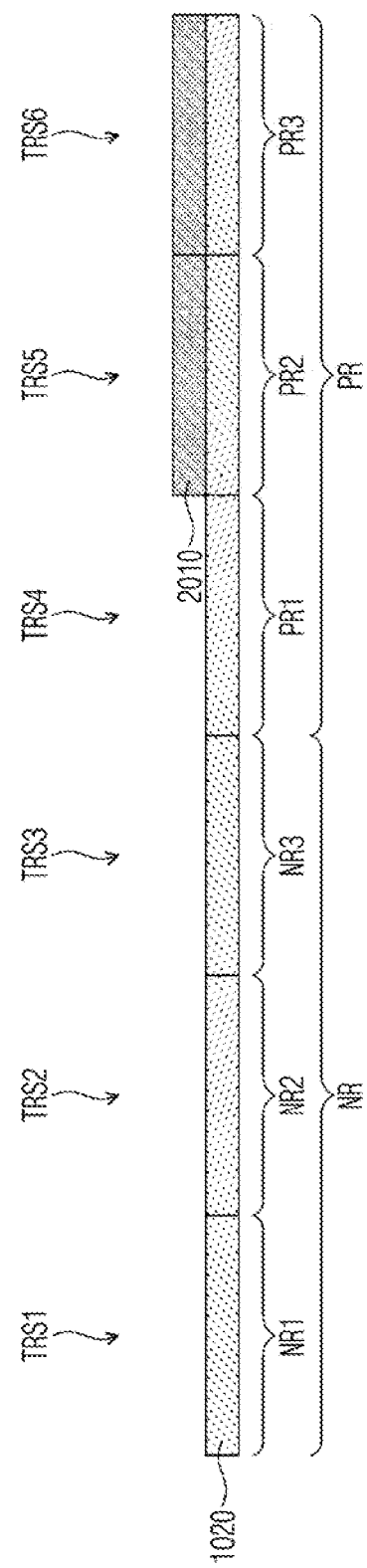

Referring to FIG. 9B, a first preliminary lower work-function pattern 2010 may be formed on the preliminary high-k dielectric layer 1020. The first preliminary lower work-function pattern 2010 may be selectively formed in an opening in which the fifth transistor TRS5 or the sixth transistor TRS6 is defined. In an implementation, the formation of the first preliminary lower work-function pattern 2010 may include forming a first preliminary work-function layer in openings formed on the PMOSFET region PR and the NMOSFET region NR, and etching the first preliminary work-function layer on the NMOSFET region NR and the first PMOSFET region PR1. The first preliminary lower work-function pattern 2010 may be formed using chemical vapor deposition (CVD) or atomic layer deposition (ALD).

The first preliminary lower work-function pattern 2010 may include a binary metal nitride, e.g., titanium nitride (TiN) or tantalum nitride (TaN), or a ternary metal nitride, e.g., titanium aluminum nitride (TiAlN), tantalum aluminum nitride (TaAlN), titanium silicon nitride (TiSiN), or tantalum silicon nitride (TaSiN).

Figure 9C:
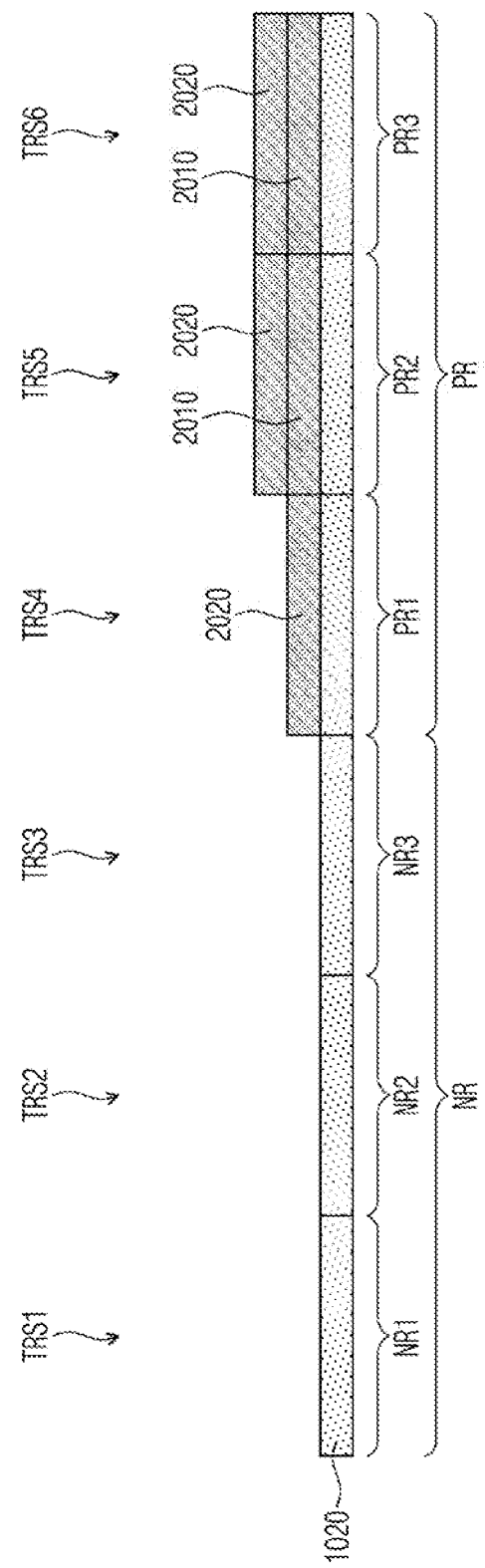

Referring to FIG. 9C, a second preliminary lower work-function pattern 2020 may be formed on the preliminary high-k dielectric layer 1020 and the first preliminary lower work-function pattern 2010. The second preliminary lower work-function pattern 2020 may be selectively formed in an opening in which is defined the fourth transistor TRS4, the fifth transistor TRS5, or the sixth transistor TRS6. In an implementation, the formation of the second preliminary lower work-function pattern 2020 may include forming a second preliminary work-function layer in openings on the PMOSFET region PR and the NMOSFET region NR, and etching the second preliminary work-function layer on the NMOSFET region NR. The second preliminary lower work-function pattern 2020 may be formed using chemical vapor deposition (CVD) or atomic layer deposition (ALD). The second preliminary lower work-function pattern 2020 may include a material the same as that of the first preliminary lower work-function pattern 2010.

Figure 9D:
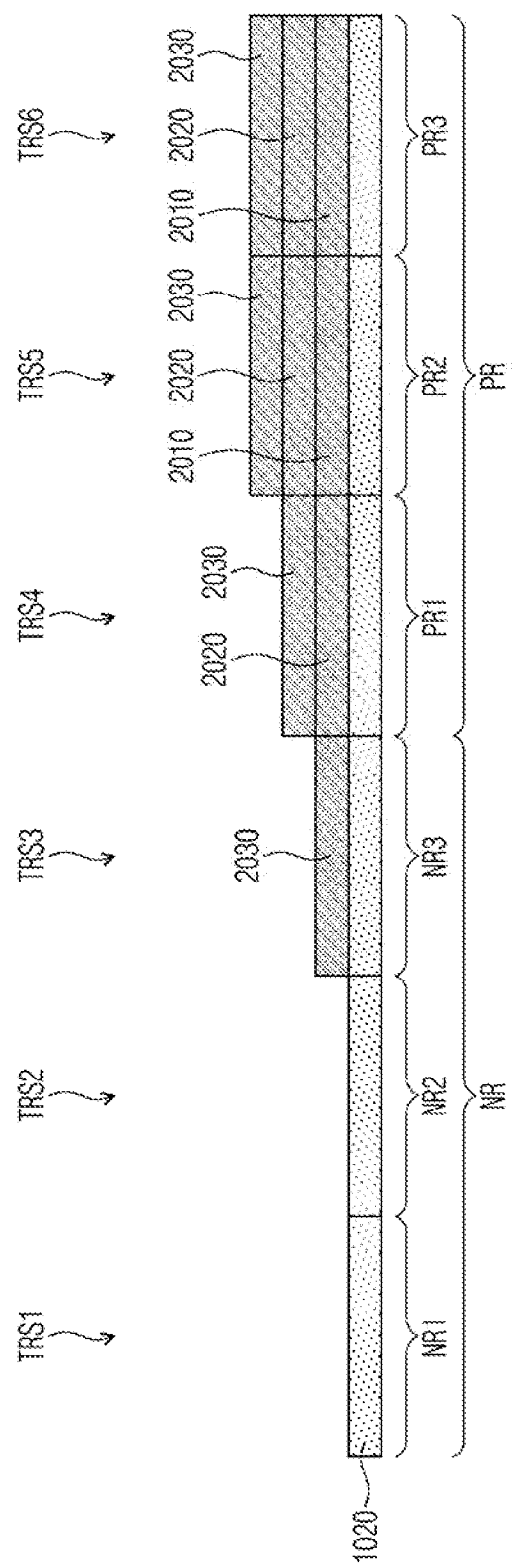

Referring to FIG. 9D, a third preliminary lower work-function pattern 2030 may be formed on the preliminary high-k dielectric layer 1020, the first preliminary lower work-function pattern 2010, and the second preliminary lower work-function pattern 2020. The third preliminary lower work-function pattern 2030 may be selectively formed in an opening of the third transistor TRS3, the fourth transistor TRS4, the fifth transistor TRS5, or the sixth transistor TRS6. In an implementation, the formation of the third preliminary lower work-function pattern 2030 may include forming a third preliminary work-function layer in openings on the PMOSFET region PR and the NMOSFET region NR, and etching the third preliminary work-function layer on the first and second NMOSFET regions NR1 and NR2. The third preliminary lower work-function pattern 2030 may be formed using chemical vapor deposition (CVD) or atomic layer deposition (ALD). The third preliminary lower work-function pattern 2030 may include a material the same as that of the first preliminary lower work-function pattern 2010 or that of the second preliminary lower work-function pattern 2020.

Figure 9E:
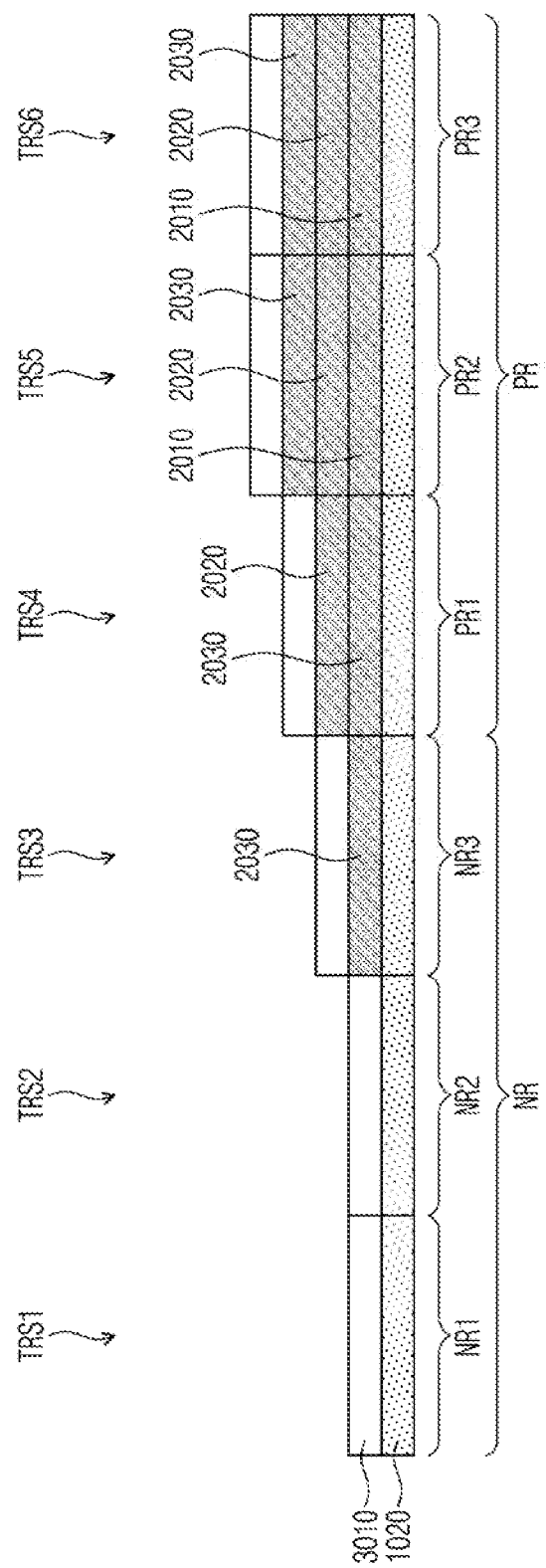

Referring to FIG. 9E, a preliminary intermediate pattern 3010 may be formed on the preliminary high-k dielectric layer 1020 and the third preliminary lower work-function pattern 2030. The preliminary intermediate pattern 3010 may be formed in openings on the PMOSFET region PR and the NMOSFET region NR. The preliminary intermediate pattern 3010 may include lanthanum oxide (LaO). The preliminary intermediate pattern 3010 may be formed using chemical vapor deposition (CVD) or atomic layer deposition (ALD). On an area where the first and second transistors TRS1 and TRS2 are defined, the preliminary intermediate pattern 3010 may be formed on (e.g., directly on) the preliminary high-k dielectric layer 1020. On an area where the third to sixth transistors TRS3 to TRS6 are defined, the preliminary intermediate pattern 3010 may be formed on the third preliminary lower work-function pattern 2030.

Figure 9F:
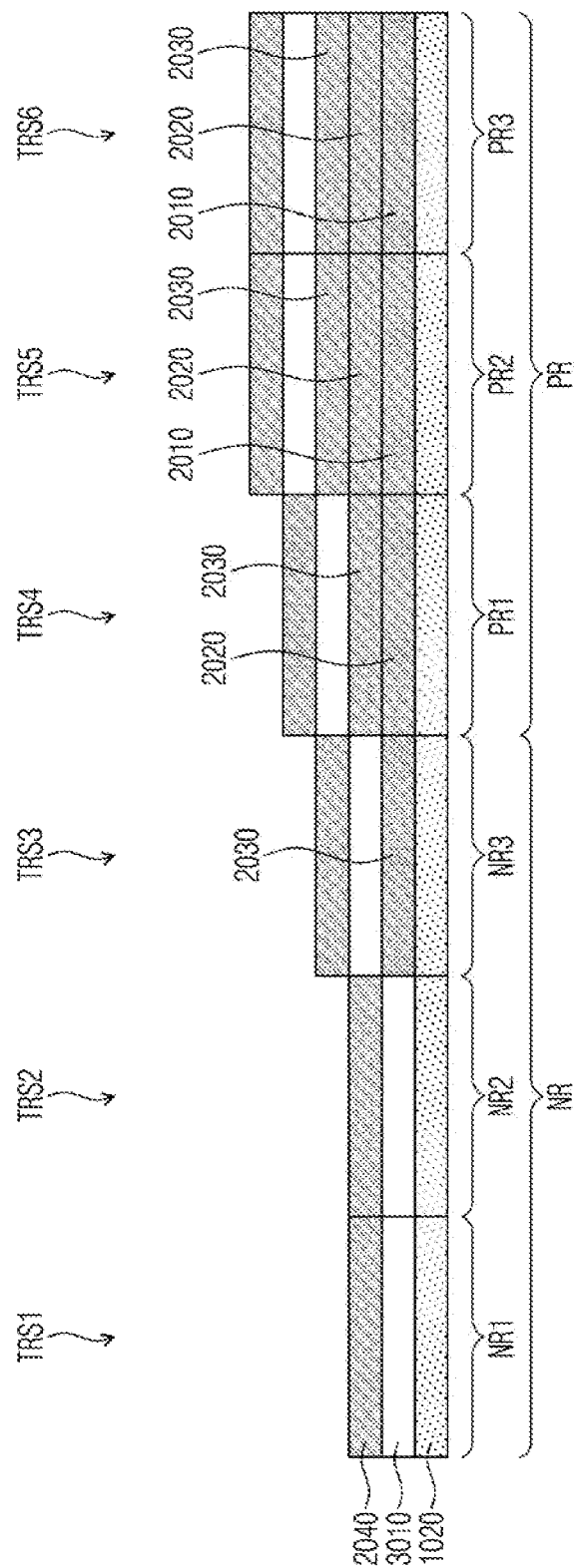

Referring to FIG. 9F, a fourth preliminary lower work-function pattern 2040 may be formed on the preliminary intermediate pattern 3010. The fourth preliminary lower work-function pattern 2040 may be formed in openings on the PMOSFET region PR and the NMOSFET region NR. The fourth preliminary lower work-function pattern 2040 may be formed using chemical vapor deposition (CVD) or atomic layer deposition (ALD). The fourth preliminary lower work-function pattern 2040 may include a material the same as that of the first preliminary lower work-function pattern 2010, that of the second preliminary lower work-function pattern 2020, or that of the third preliminary lower work-function pattern 2030.

Figure 9G:
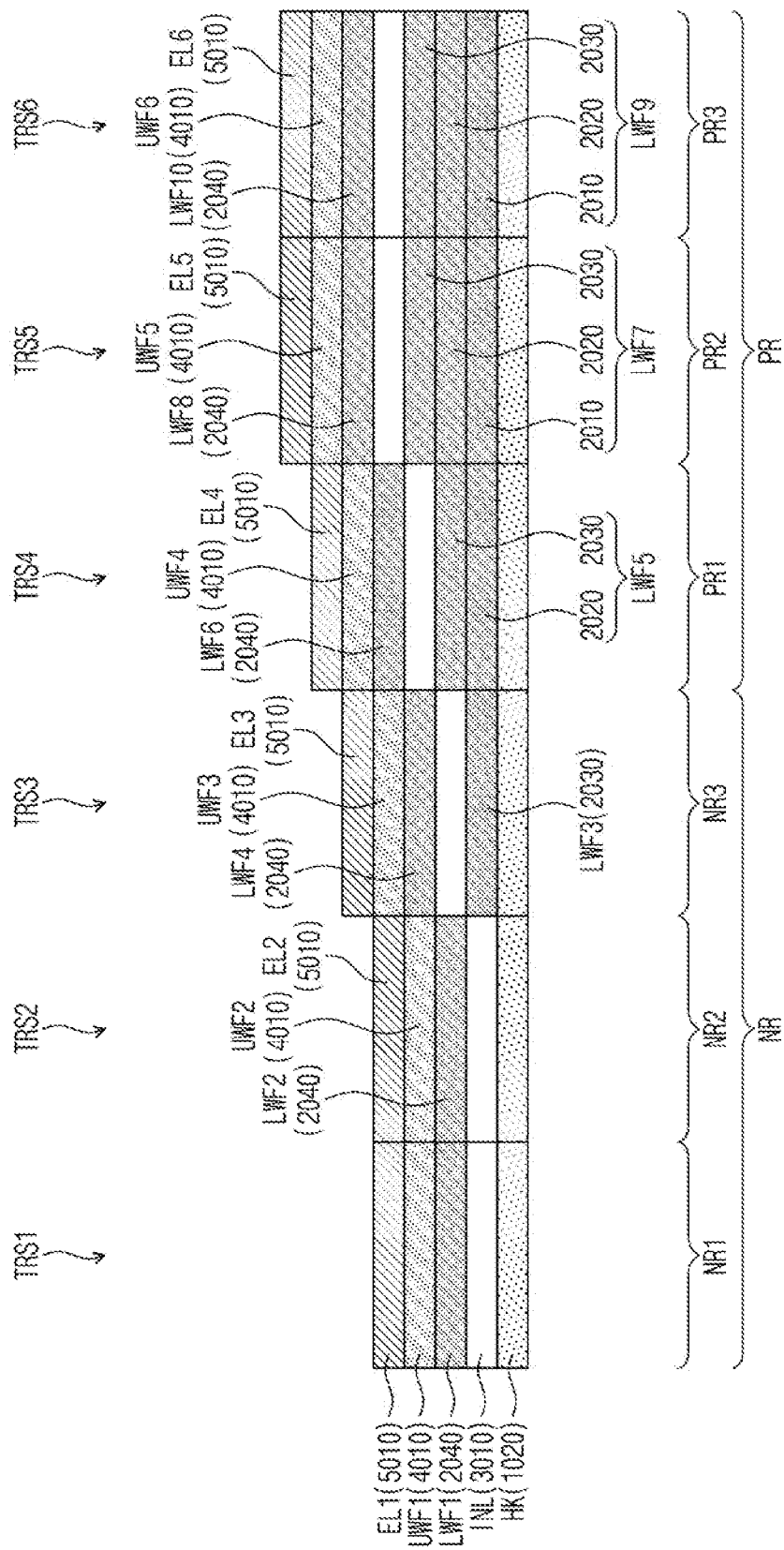

Referring to FIG. 9G, a preliminary upper work-function pattern 4010 and a preliminary electrode pattern 5010 may be sequentially formed on the fourth preliminary lower work-function pattern 2040. The preliminary upper work-function pattern 4010 and the preliminary electrode pattern 5010 may be formed in openings on the PMOSFET region PR and the NMOSFET region NR. The preliminary upper work-function pattern 4010 and the preliminary electrode pattern 5010 may be formed using chemical vapor deposition (CVD) or atomic layer deposition (ALD).

The preliminary high-k dielectric layer 1020 may constitute a high-k dielectric layer HK discussed with reference to FIGS. 3 and 4. The preliminary intermediate pattern 3010 may constitute intermediate patterns INL discussed with reference to FIGS. 3 and 4. In an implementation, the preliminary intermediate pattern 3010 may constitute first to sixth intermediate patterns INL1 to INL6. The fourth preliminary lower work-function pattern 2040 may constitute a first lower metal pattern LWF1, a second lower metal pattern LWF2, a fourth lower metal pattern LWF4, a sixth lower metal pattern LWF6, an eighth lower metal pattern LWF8, and a tenth lower metal pattern LWF10. The third preliminary lower work-function pattern 2030 may constitute a third lower metal pattern LWF3. The second preliminary lower work-function pattern 2020 and the third preliminary lower work-function pattern 2030 may constitute a fifth lower metal pattern LWF5. The first preliminary lower work-function pattern 2010, the second preliminary lower work-function pattern 2020, and the third preliminary lower work-function pattern 2030 may constitute a seventh lower metal pattern LWF7 and a ninth lower metal pattern LWF9.

The preliminary upper work-function pattern 4010 may constitute first to sixth upper metal patterns UWF1 to UWF6. The preliminary electrode pattern 5010 may constitute first to sixth electrode patterns EL1 to EL6.

Figure 10:
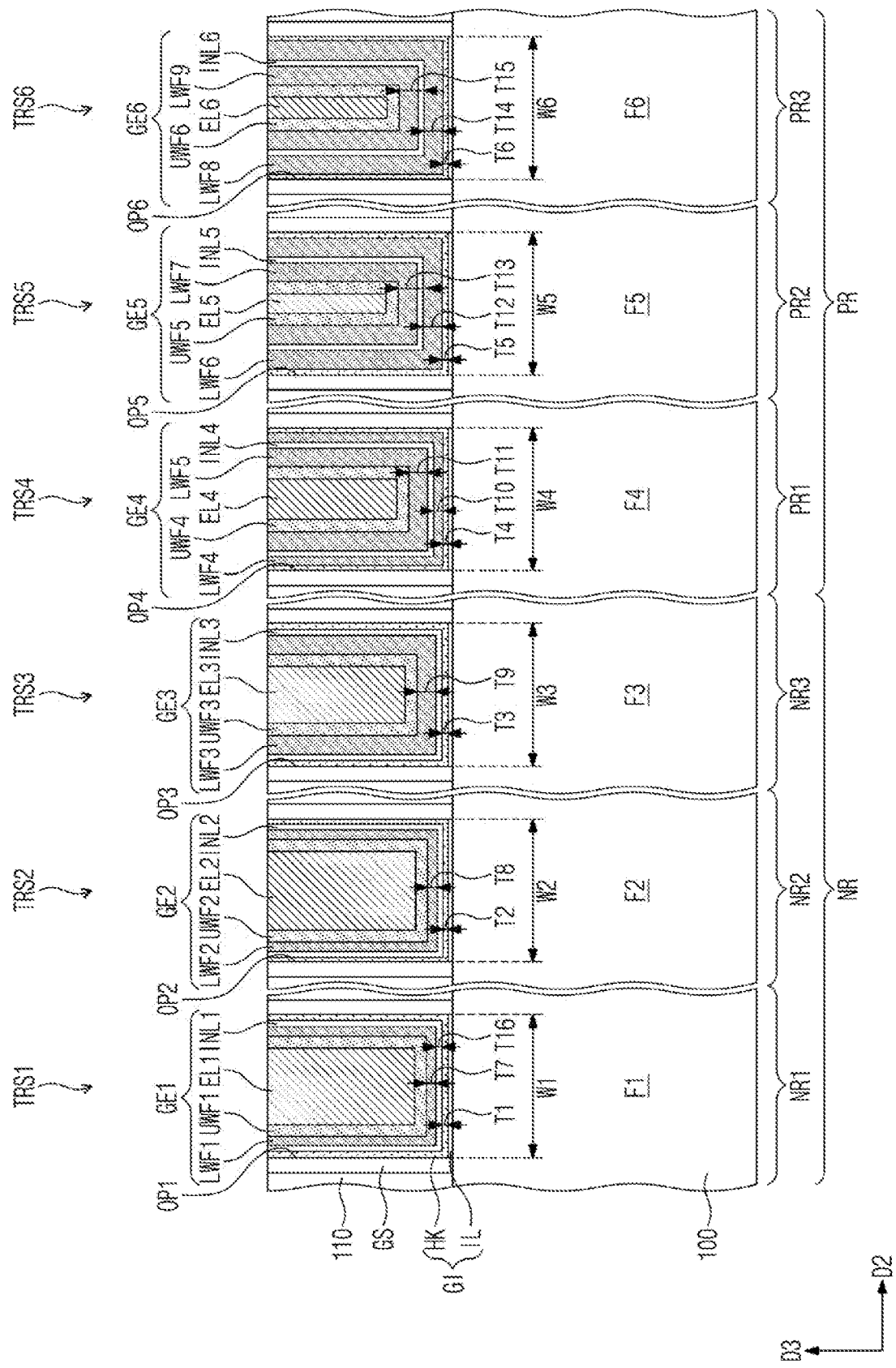
FIG. 10 illustrates an enlarged cross-sectional view of gate electrodes depicted in FIGS. 2A and 2B, showing a semiconductor device according to some embodiments.
Figure 11:
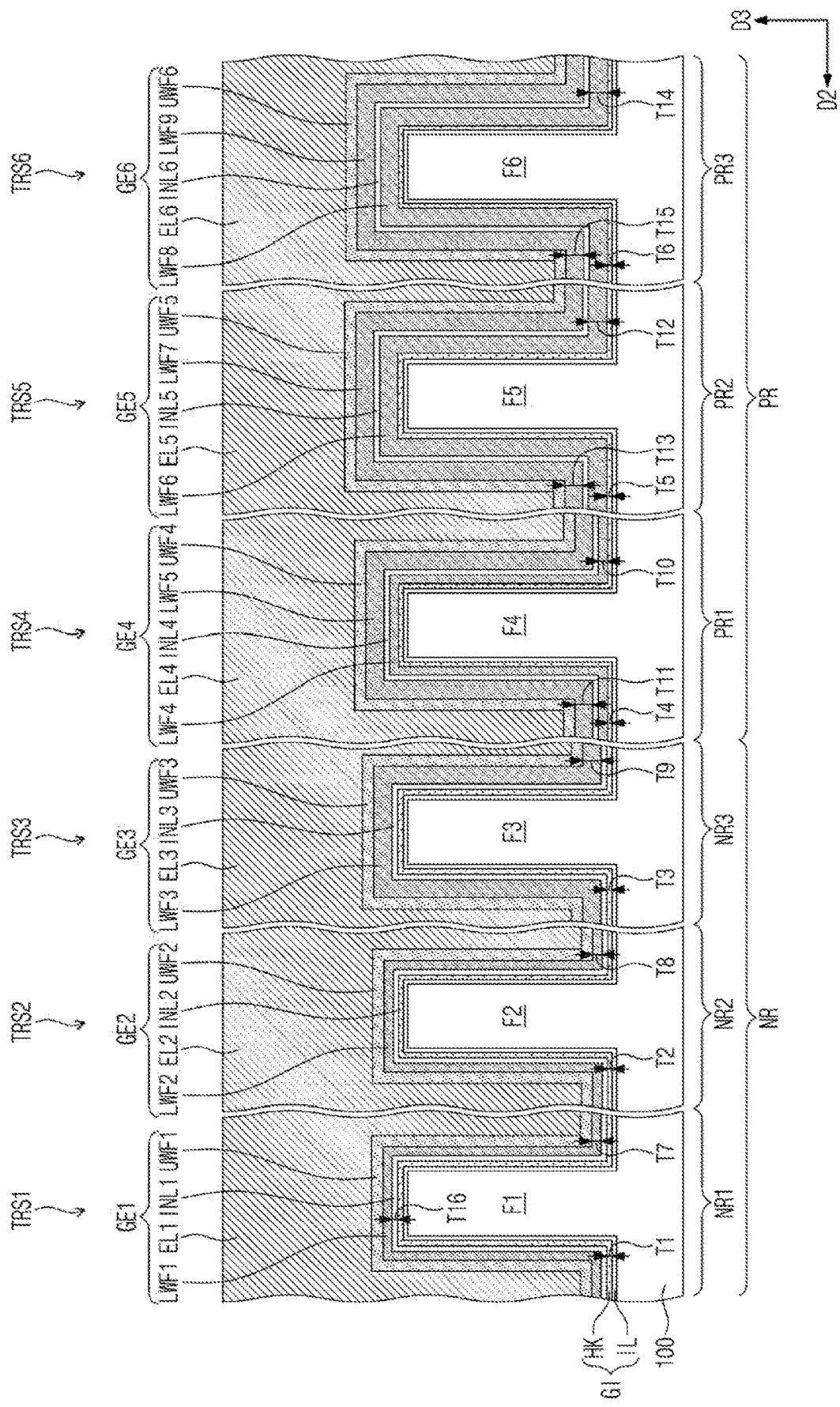
FIG. 11 illustrates an enlarged cross-sectional view of active patterns depicted in FIG. 2D, showing a semiconductor device according to some embodiments.
Figure 12:
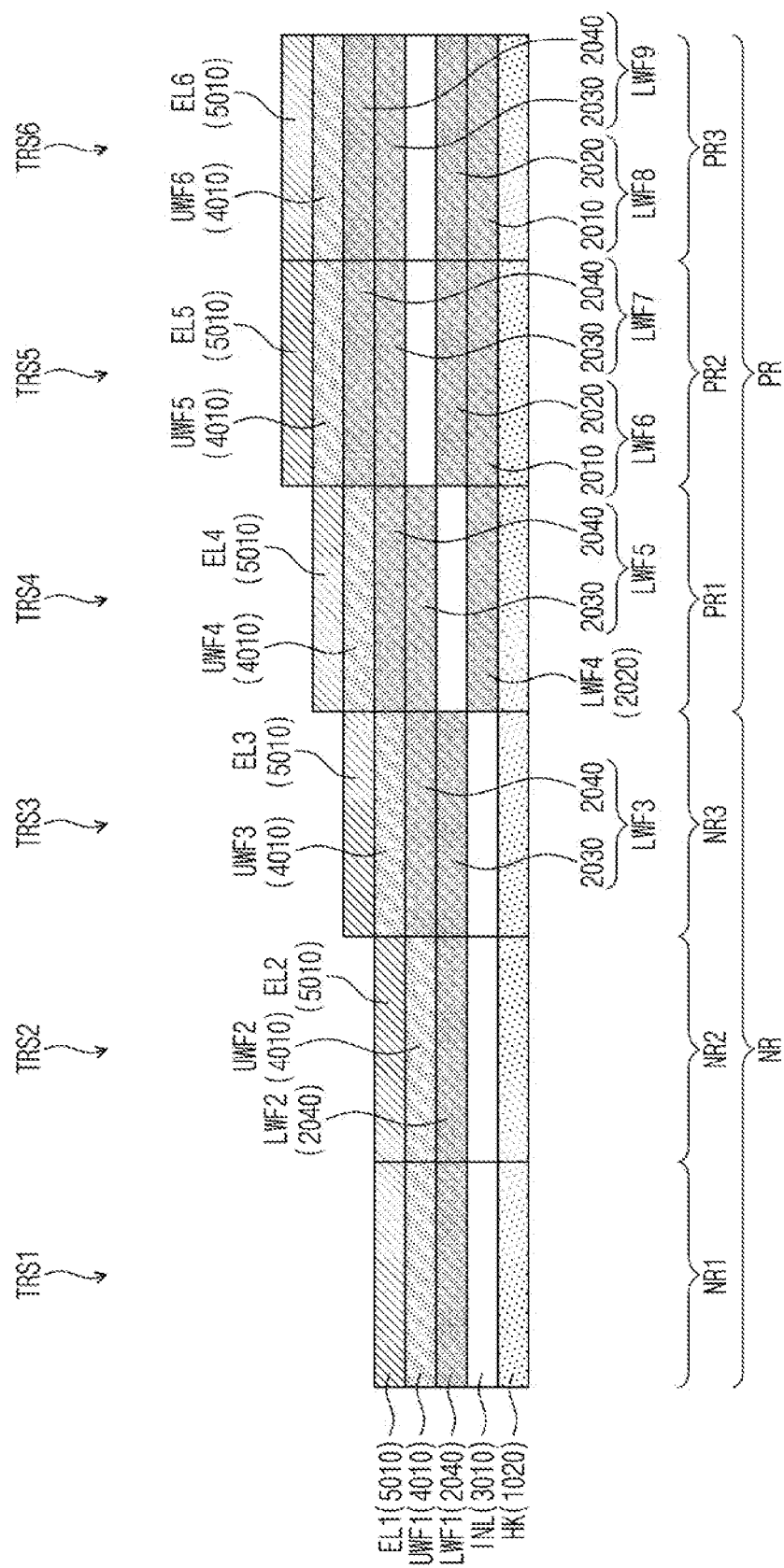
FIG. 12 illustrates a conceptual view showing a gate dielectric layer and a gate electrode according to some embodiments.

FIG. 10 illustrates an enlarged cross-sectional view of gate electrodes depicted in FIGS. 2A and 2B, showing a semiconductor device according to some embodiments. FIG. 11 illustrates an enlarged cross-sectional view of active patterns depicted in FIG. 2D, showing a semiconductor device according to some embodiments. FIG. 12 illustrates a conceptual view showing a gate dielectric layer and a gate electrode according to some embodiments. In the embodiment that follows, a description of features repetitive to those discussed with reference to FIGS. 1, 2A to 2D, 3, 4, and 9G may be omitted, and a difference thereof will be explained in detail.

Referring to FIGS. 10 and 11, the third gate electrode GE3 may include a third intermediate pattern INL3, a third lower metal pattern LWF3, a third upper metal pattern UWF3, and a third electrode pattern EL3 that are sequentially stacked. The third gate electrode GE3 may have a structure and a material substantially the same as or similar to those of the first gate electrode GE1.

The fourth gate electrode GE4 may include a fourth lower metal pattern LWF4, a fourth intermediate pattern INL4, a fifth lower metal pattern LWF5, a fourth upper metal pattern UWF4, and a fourth electrode pattern EL4 that are sequentially stacked. The fifth gate electrode GE5 may include a sixth lower metal pattern LWF6, a fifth intermediate pattern INL5, a seventh lower metal pattern LWF7, a fifth upper metal pattern UWF5, and a fifth electrode pattern EL5 that are sequentially stacked. The sixth gate electrode GE6 may include an eighth lower metal pattern LWF8, a sixth intermediate pattern INL6, a ninth lower metal pattern LWF9, a sixth upper metal pattern UWF6, and a sixth electrode pattern EL6 that are sequentially stacked.

Each of the fourth, fifth, and sixth gate electrodes GE4, GE5, and GE6 may have a structure and a material substantially the same as or similar to those of the third gate electrode GE3 discussed with reference to FIGS. 3 and 4.

The first to ninth lower metal patterns LWF1 to LWF9 may have respective seventh to fifteenth thicknesses T7 to T15. The seventh thickness T7 may be substantially the same as the eighth thickness T8 and the tenth thickness T10. The ninth thickness T9 may be substantially the same as the eleventh thickness T11, the twelfth thickness T12, the thirteenth thickness T13, the fourteenth thickness T14, and the fifteenth thickness T15. The ninth thickness T9 may be greater than the seventh thickness T7.

A sixteenth thickness T16 may be given as a thickness of each of the first to sixth intermediate patterns INL1 to INL6. The sixteenth thickness T16 may be less than the seventh thickness T7. The intermediate patterns INL may have their thicknesses each of which is less than that of each of the lower metal patterns LWF. In an implementation, a ratio of the sixteenth thickness T16 to the seventh thickness T7 may range from about ¹/₂₅ to about ½.

Referring to FIG. 12, the fourth preliminary lower work-function pattern 2040 may constitute a first lower metal pattern LWF1 and a second lower metal pattern LWF2. The third preliminary lower work-function pattern 2030 and the fourth preliminary lower work-function pattern 2040 may constitute a third lower metal pattern LWF3, a fifth lower metal pattern LWF5, a seventh lower metal pattern LWF7, and a ninth lower metal pattern LWF9. The second preliminary lower work-function pattern 2020 may constitute a fourth lower metal pattern LWF4. The first preliminary lower work-function pattern 2010 and the second preliminary lower work-function pattern 2020 may constitute a sixth lower metal pattern LWF6 and an eighth lower metal pattern LWF8.

Figure 13:
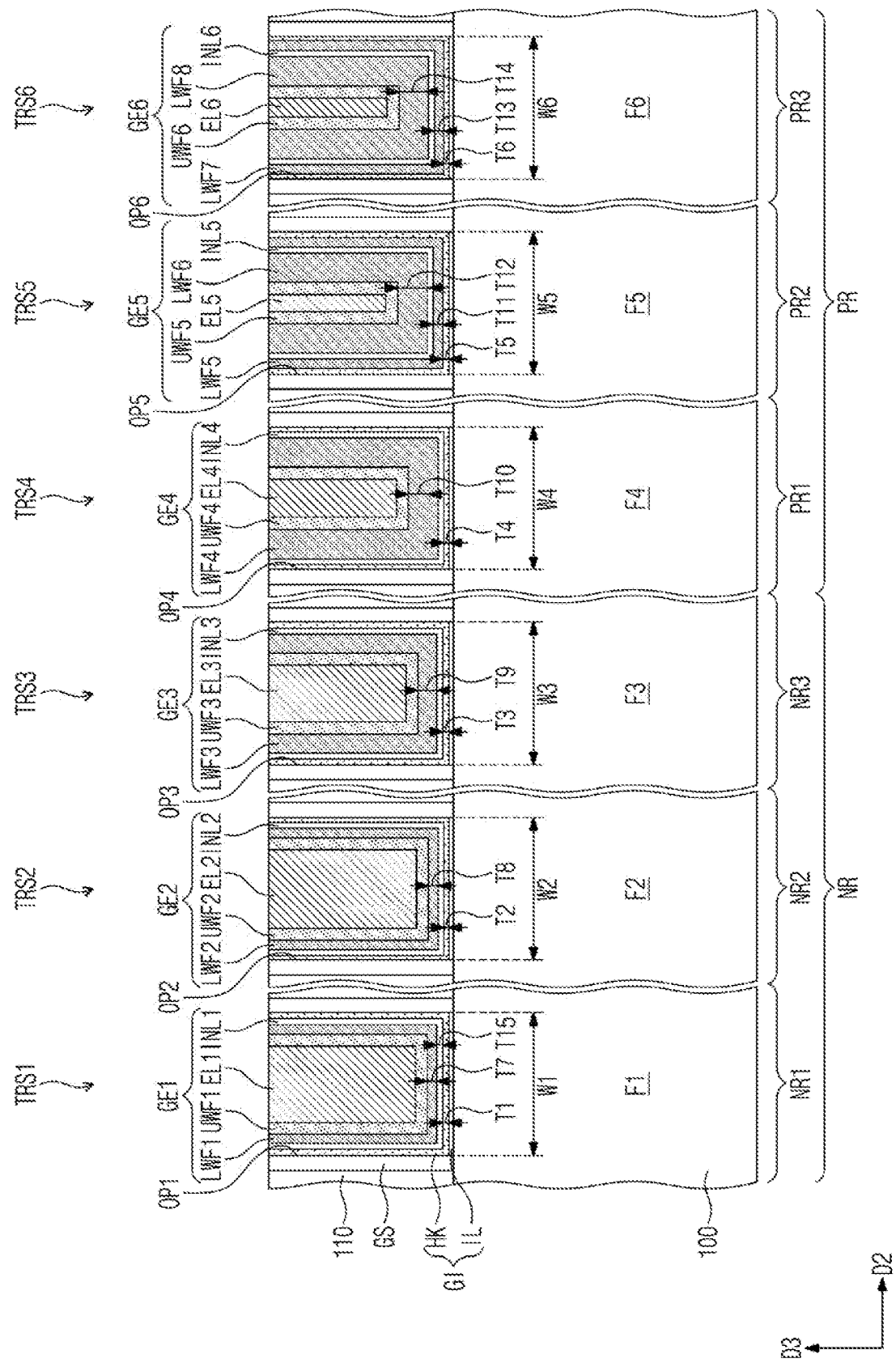
FIG. 13 illustrates an enlarged cross-sectional view of gate electrodes depicted in FIGS. 2A and 2B, showing a semiconductor device according to some embodiments.
Figure 14:
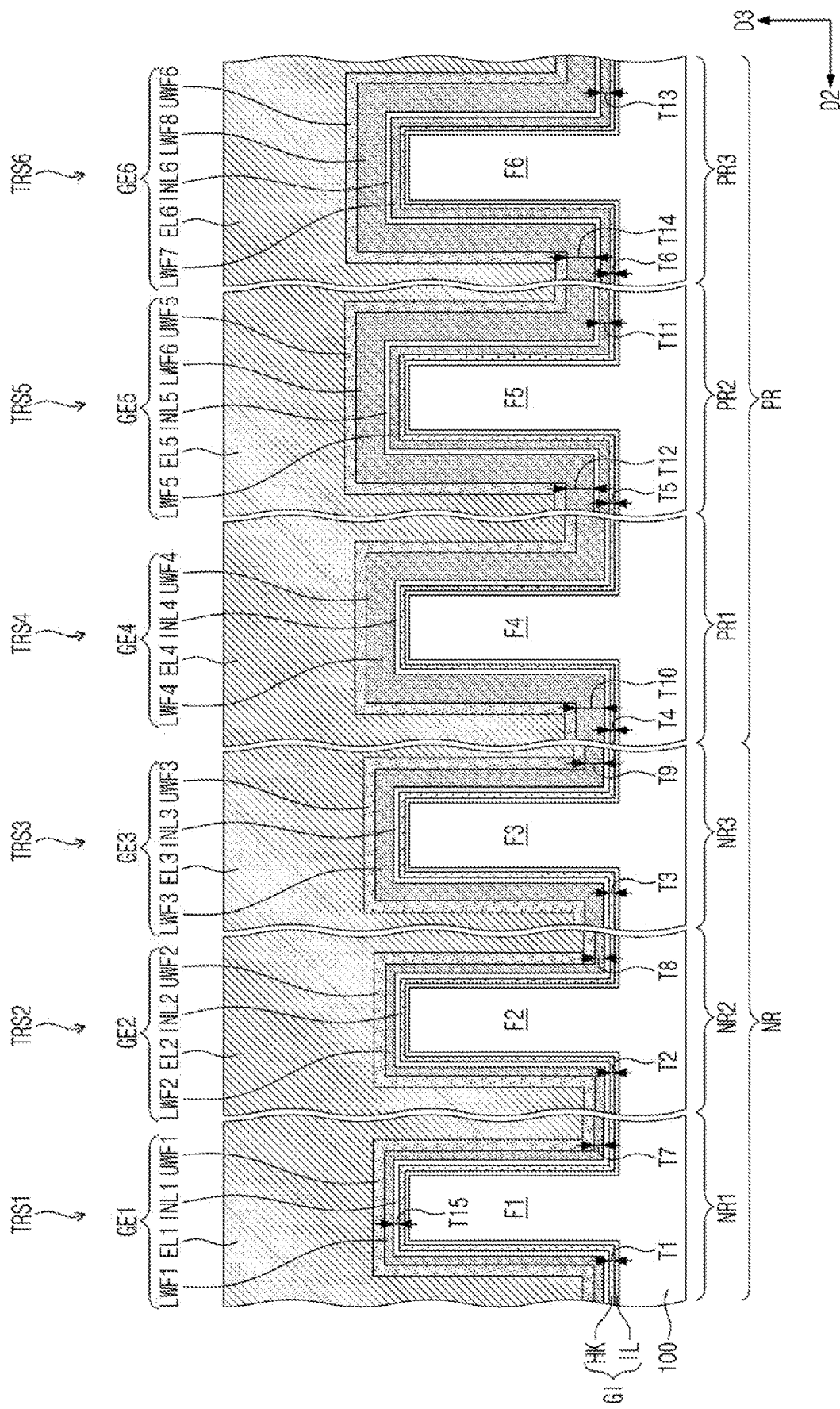
FIG. 14 illustrates an enlarged sectional view of active patterns depicted in FIG. 2D, showing a semiconductor device according to some embodiments.
Figure 15:
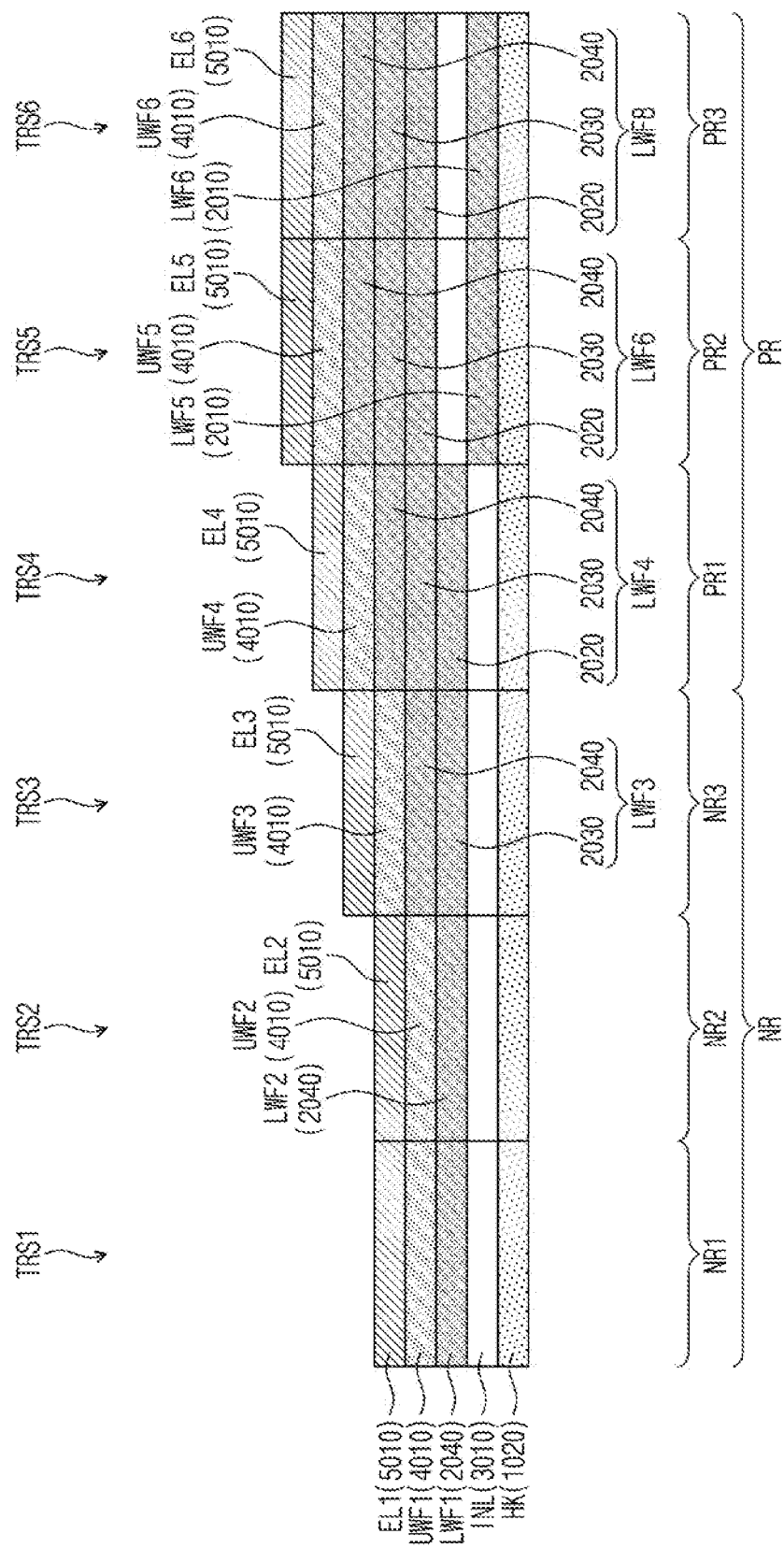
FIG. 15 illustrates a conceptual view showing a gate dielectric layer and a gate electrode according to some embodiments.

FIG. 13 illustrates an enlarged cross-sectional view of gate electrodes depicted in FIGS. 2A and 2B, showing a semiconductor device according to some embodiments. FIG. 14 illustrates an enlarged sectional view of active patterns depicted in FIG. 2D, showing a semiconductor device according to some embodiments. FIG. 15 illustrates a conceptual view showing a gate dielectric layer and a gate electrode according to some embodiments. In the embodiment that follows, a description of features repetitive to those discussed with reference to FIGS. 1, 2A to 2D, 3, 4, and 9G will be omitted, and a difference thereof will be explained in detail.

Referring to FIGS. 13 and 14, the third gate electrode GE3 may include a third intermediate pattern INL3, a third lower metal pattern LWF3, a third upper metal pattern UWF3, and a third electrode pattern EL3 that are sequentially stacked. The fourth gate electrode GE4 may include a fourth intermediate pattern INL4, a fourth lower metal pattern LWF4, a fourth upper metal pattern UWF4, and a fourth electrode pattern EL4 that are sequentially stacked. The third gate electrode GE3 and the fourth gate electrode GE4 may have a structure and a material substantially the same as or similar to those of the first gate electrode GE1.

The fifth gate electrode GE5 may include a fifth lower metal pattern LWF5, a fifth intermediate pattern INL5, a sixth lower metal pattern LWF6, a fifth upper metal pattern UWF5, and a fifth electrode pattern EL5 that are sequentially stacked. The sixth gate electrode GE6 may include a seventh lower metal pattern LWF7, a sixth intermediate pattern INL6, an eighth lower metal pattern LWF8, a sixth upper metal pattern UWF6, and a sixth electrode pattern EL6 that are sequentially stacked.

Each of the fifth and sixth gate electrodes GE5 and GE6 may have a structure and a material substantially the same as or similar to those of the third gate electrode GE3 discussed with reference to FIGS. 3 and 4.

The first to eighth lower metal patterns LWF1 to LWF8 may have respective seventh to fourteenth thicknesses T7 to T14. The seventh thickness T7 may be substantially the same as the eighth thickness T8, the eleventh thickness T11, and the thirteenth thickness T13. The ninth thickness T9 may be greater than the seventh thickness T7. The tenth thickness T10 may be substantially the same as the twelfth thickness T12 and the fourteenth thickness T14. The tenth thickness T10 may be greater than the ninth thickness T9.

A fifteenth thickness T15 may be a thickness of each of the first to sixth intermediate patterns INL1 to INL6. The fifteenth thickness T15 may be less than the seventh thickness T7. The intermediate patterns INL may have their thicknesses each of which is less than that of each of the lower metal patterns LWF. In an implementation, a ratio of the fifteenth thickness T15 to the seventh thickness T7 may range from about ¹/₂₅ to about ½.

Referring to FIG. 15, the fourth preliminary lower work-function pattern 2040 may constitute a first lower metal pattern LWF1 and a second lower metal pattern LWF2. The third preliminary lower work-function pattern 2030 and the fourth preliminary lower work-function pattern 2040 may constitute a third lower metal pattern LWF3. The second preliminary lower work-function pattern 2020, the third preliminary lower work-function pattern 2030, and the fourth preliminary lower work-function pattern 2040 may constitute a fourth lower metal pattern LWF4, a sixth lower metal pattern LWF6, and an eighth lower metal pattern LWF8. The first preliminary lower work-function pattern 2010 may constitute a fifth lower metal pattern LWF5 and a seventh lower metal pattern LWF7.

Figure 16:
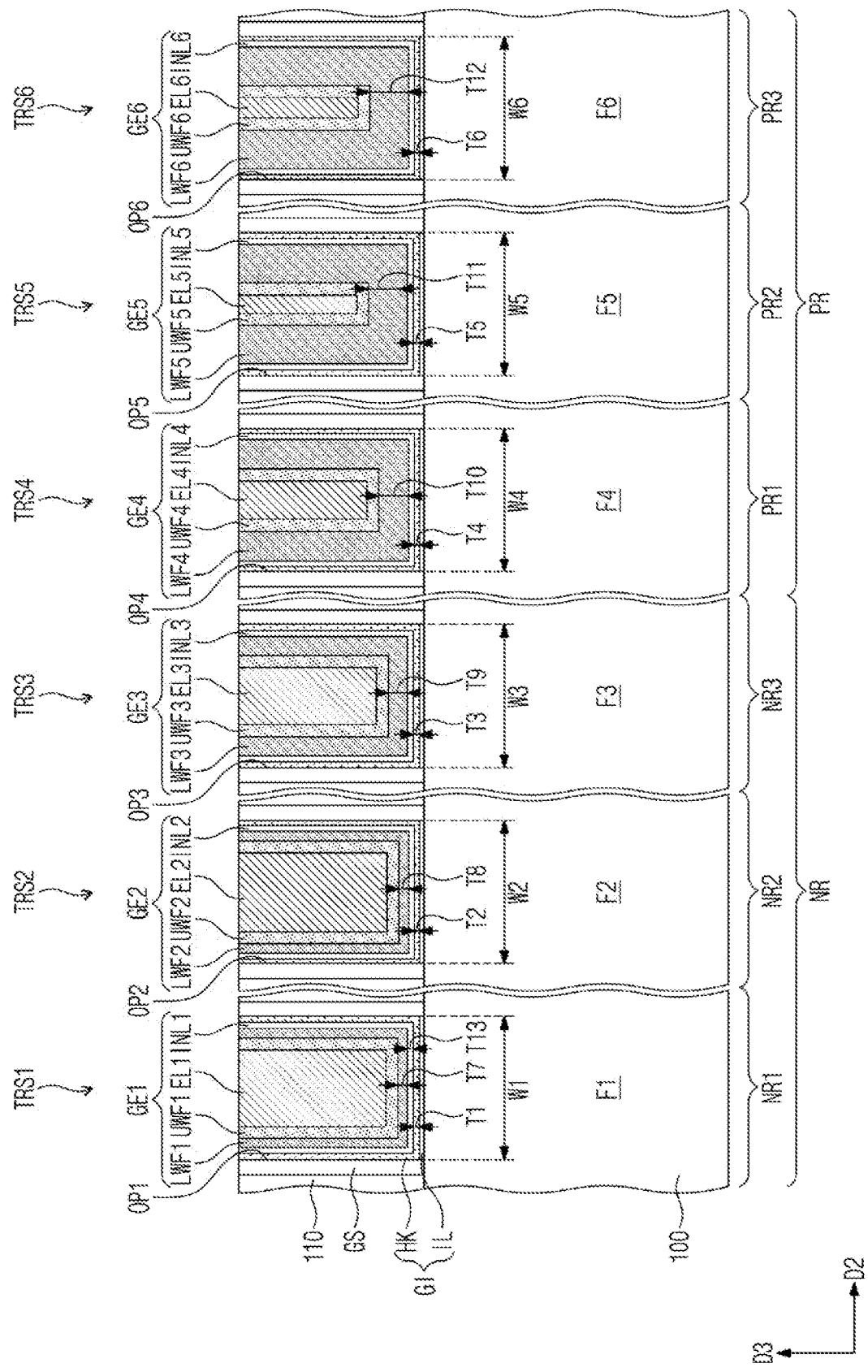
FIG. 16 illustrates an enlarged cross-sectional view of gate electrodes depicted in FIGS. 2A and 2B, showing a semiconductor device according to some embodiments.
Figure 17:
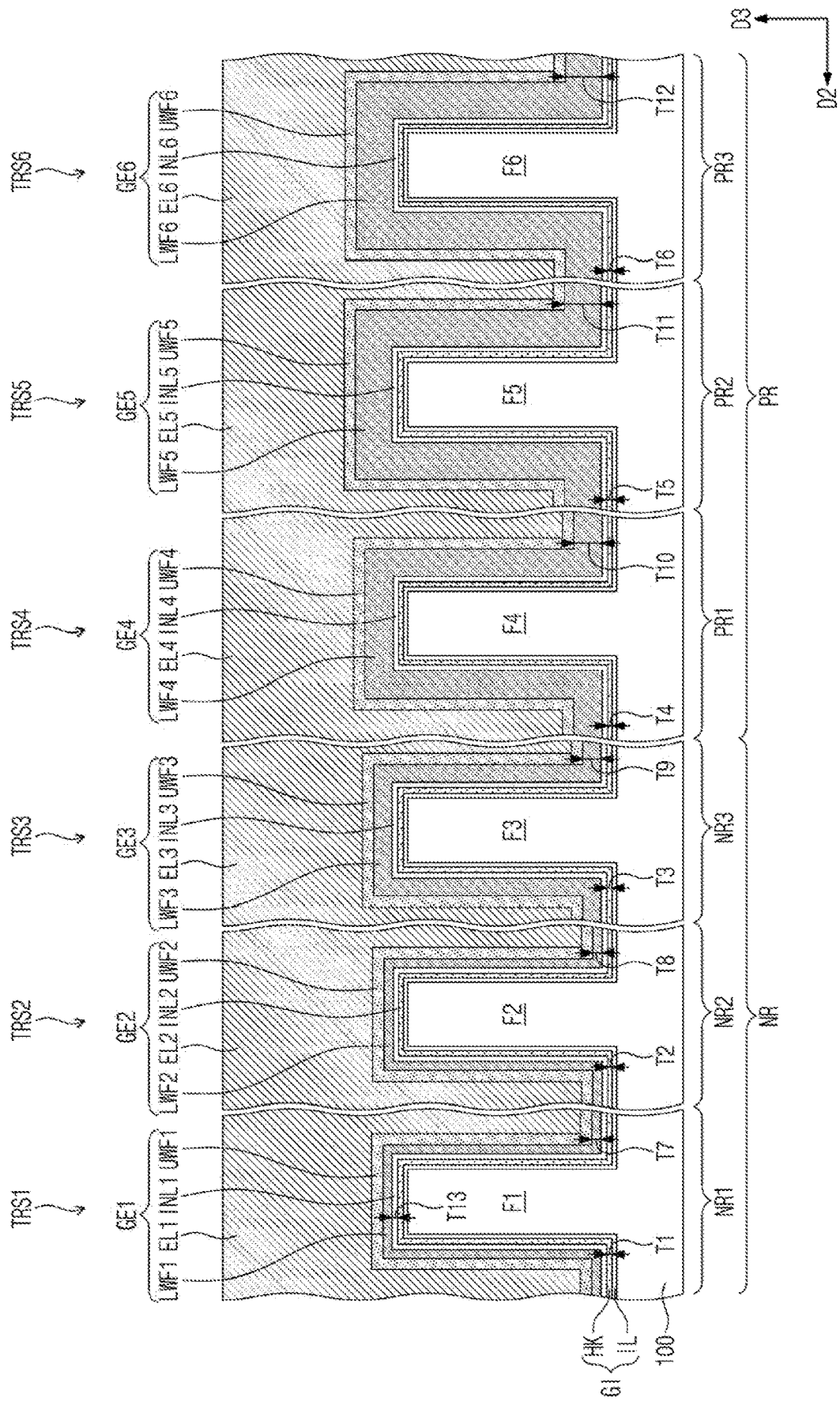
FIG. 17 illustrates an enlarged cross-sectional view of active patterns depicted in FIG. 2D, showing a semiconductor device according to some embodiments.
Figure 18:
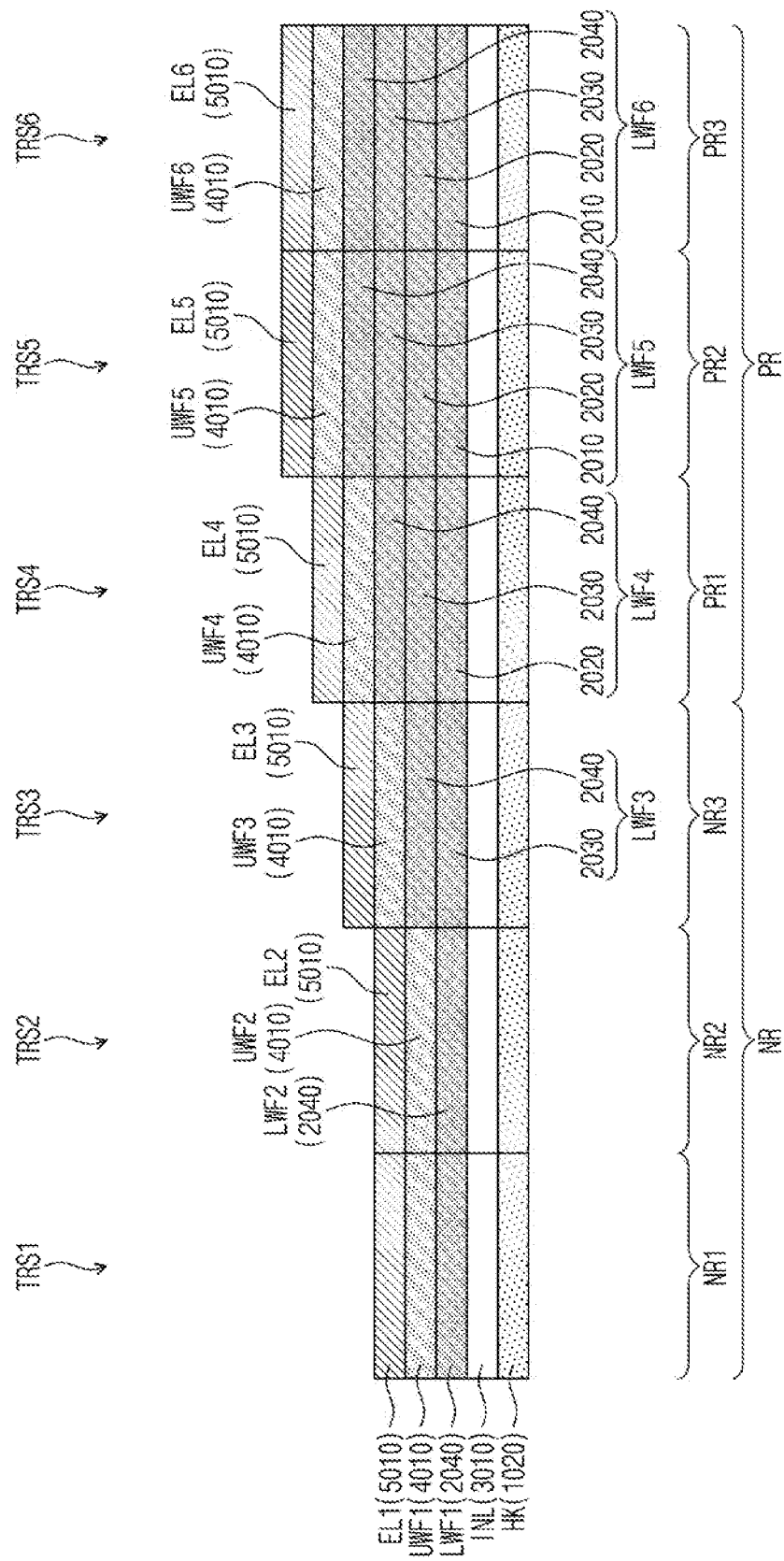
FIG. 18 illustrates a conceptual view showing a gate dielectric layer and a gate electrode according to some embodiments.

FIG. 16 illustrates an enlarged cross-sectional view of gate electrodes depicted in FIGS. 2A and 2B, showing a semiconductor device according to some embodiments. FIG. 17 illustrates an enlarged cross-sectional view of active patterns depicted in FIG. 2D, showing a semiconductor device according to some embodiments. FIG. 18 illustrates a conceptual view showing a gate dielectric layer and a gate electrode according to some embodiments. In the embodiment that follows, a description of features repetitive to those discussed with reference to FIGS. 1, 2A to 2D, 3, 4, and 9G will be omitted, and a difference thereof will be explained in detail.

Referring to FIGS. 16 and 17, the third gate electrode GE3 may include a third intermediate pattern INL3, a third lower metal pattern LWF3, a third upper metal pattern UWF3, and a third electrode pattern EL3 that are sequentially stacked. The fourth gate electrode GE4 may include a fourth intermediate pattern INL4, a fourth lower metal pattern LWF4, a fourth upper metal pattern UWF4, and a fourth electrode pattern EL4 that are sequentially stacked. The fifth gate electrode GE5 may include a fifth intermediate pattern INL5, a fifth lower metal pattern LWF5, a fifth upper metal pattern UWF5, and a fifth electrode pattern EL5 that are sequentially stacked. The sixth gate electrode GE6 may include a sixth intermediate pattern INL6, a sixth lower metal pattern LWF6, a sixth upper metal pattern UWF6, and a sixth electrode pattern EL6 that are sequentially stacked.

Each of the third, fourth, fifth, and sixth gate electrodes GE3, GE4, GE5, and GE6 may have a structure and a material substantially the same as or similar to those of the first gate electrode GE1.

The first to sixth lower metal patterns LWF1 to LWF6 may have respective seventh to twelfth thicknesses T7 to T12. The seventh thickness T7 may be substantially the same as the eighth thickness T8. The ninth thickness T9 may be greater than the seventh thickness T7. The tenth thickness T10 may be greater than the ninth thickness T9. The eleventh thickness T11 may be greater than the tenth thickness T10. The eleventh thickness T11 may be substantially the same as the twelfth thickness T12.

A thirteenth thickness T13 may be a thickness of each of the first to sixth intermediate patterns INL1 to INL6. The thirteenth thickness T13 may be less than the seventh thickness T7. The intermediate patterns INL may have their thicknesses each of which is less than that of each of the lower metal patterns LWF. In an implementation, a ratio of the thirteenth thickness T13 to the seventh thickness T7 may range from about $1/25$ to about $1/2$.

Referring to FIG. 18, the fourth preliminary lower workfunction pattern 2040 may constitute a first lower metal pattern LWF1 and a second lower metal pattern LWF2. The third preliminary lower work-function pattern 2030 and the fourth preliminary lower work-function pattern 2040 may constitute a third lower metal pattern LWF3. The second, third, and fourth preliminary lower work-function patterns 2020, 2030, and 2040 may constitute a fourth lower metal pattern LWF4. The first, second, third, and fourth preliminary lower work-function patterns 2010, 2020, 2030, and 2040 may constitute a fifth lower metal pattern LWF5 and a sixth lower metal pattern LWF6.

FIGS. 19A, 19B, 19C, and 19D illustrate cross-sectional views respectively taken along lines A-A', B-B', C-C', and D-D' of FIG. 1, showing a semiconductor device according to some embodiments. FIG. 20A illustrates an enlarged cross-sectional view showing section M of FIG. 19A. FIG. 20B illustrates an enlarged cross-sectional view showing section N of FIG. 19B. FIG. 20C illustrates an enlarged cross-sectional view showing section O of FIG. 19C. FIG. 20D illustrates an enlarged view showing section P of FIG. 19C. In the embodiment that follows, a description of features repetitive to those discussed with reference to FIGS. 1 and 2A to 2D will be omitted, and a difference thereof will be discussed in detail.

Referring to FIGS. 19A to 19D, the first active pattern AP1 may include first semiconductor patterns SP1 that are vertically stacked. The first semiconductor patterns SP1 may constitute a first channel pattern CH1. The stacked first channel patterns CH1 may be spaced apart from each other in the third direction D3. The stacked first channel patterns CH1 may vertically overlap each other. The second active pattern AP2 may include second semiconductor patterns SP2 that are vertically stacked. The second semiconductor patterns SP2 may constitute a second channel pattern CH2. The stacked second channel patterns CH2 may be spaced apart from each other in the third direction D3. The stacked second channel patterns CH2 may vertically overlap each other. The first and second channel patterns CH1 and CH2 may include, e.g., silicon (Si), germanium (Ge), or silicongermanium (SiGe).

The first active pattern AP1 may further include first source/drain patterns SD1. The stacked first channel patterns CH1 may be between a pair of neighboring first source/drain patterns SD1. The stacked first channel patterns CH1 may connect to each other the pair of neighboring first source/drain patterns SD1.

The second active pattern AP2 may further include second source/drain patterns SD2. The stacked second channel patterns CH2 may be between a pair of neighboring second source/drain patterns SD2. The stacked second channel patterns CH2 may connect to each other the pair of neighboring second source/drain patterns SD2.

A plurality of gate electrodes GE may extend in the first direction D1 and run across the first and second channel patterns CH1 and CH2. The gate electrode GE may vertically overlap the first and second channel patterns CH1 and CH2. A pair of gate spacers GS may be on opposite sidewalls of the gate electrode GE. A gate capping pattern GP may be on the gate electrode GE.

Figure 19A:
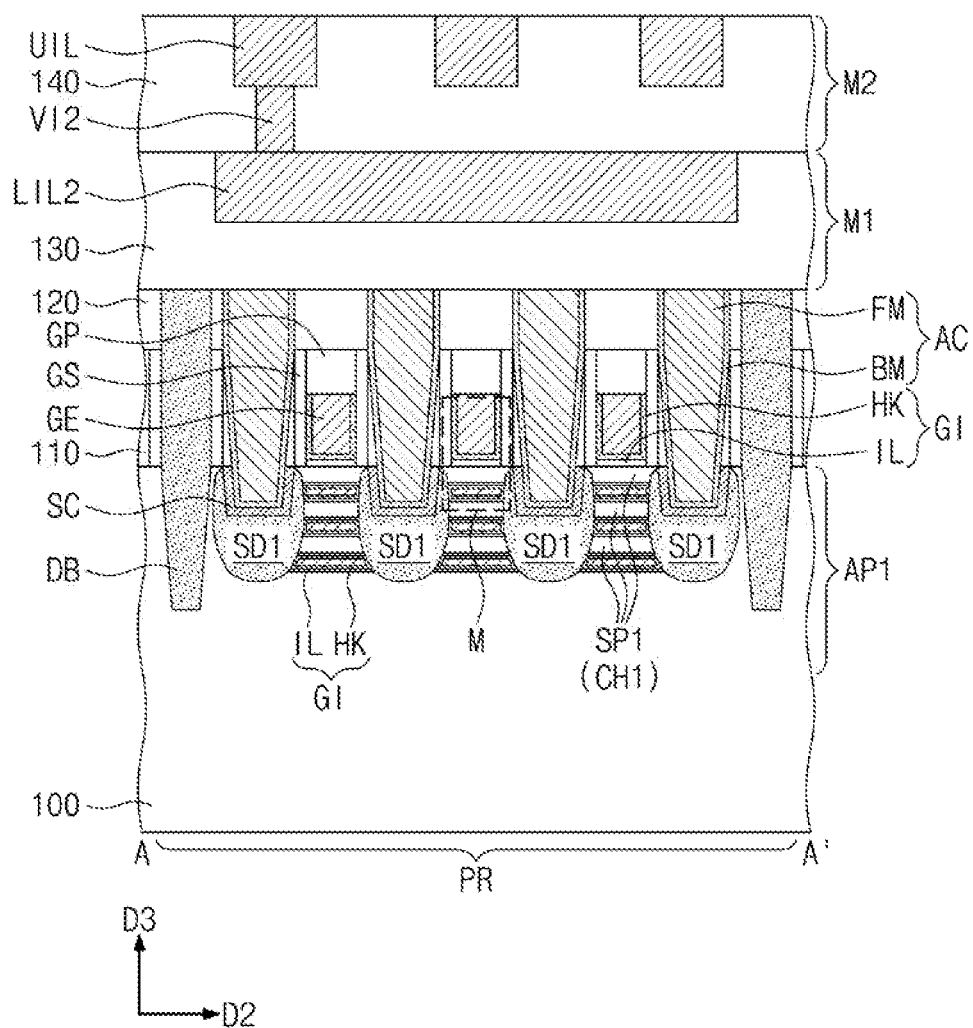
FIGS. 19A, 19B, 19C, and 19D illustrate cross-sectional views respectively taken along lines A-A', B-B', C-C', and D-D' of FIG. 1, showing a semiconductor device according to some embodiments.
Figure 19B:
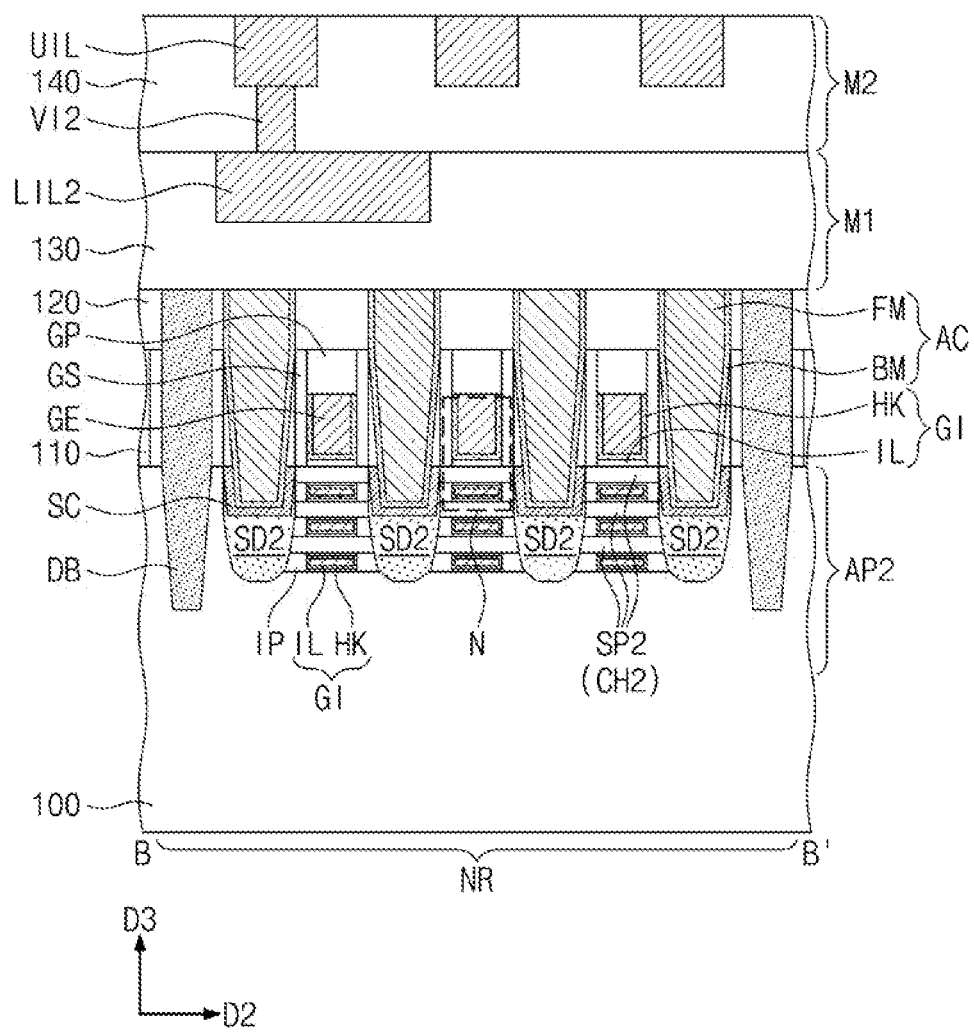
Figure 19C:
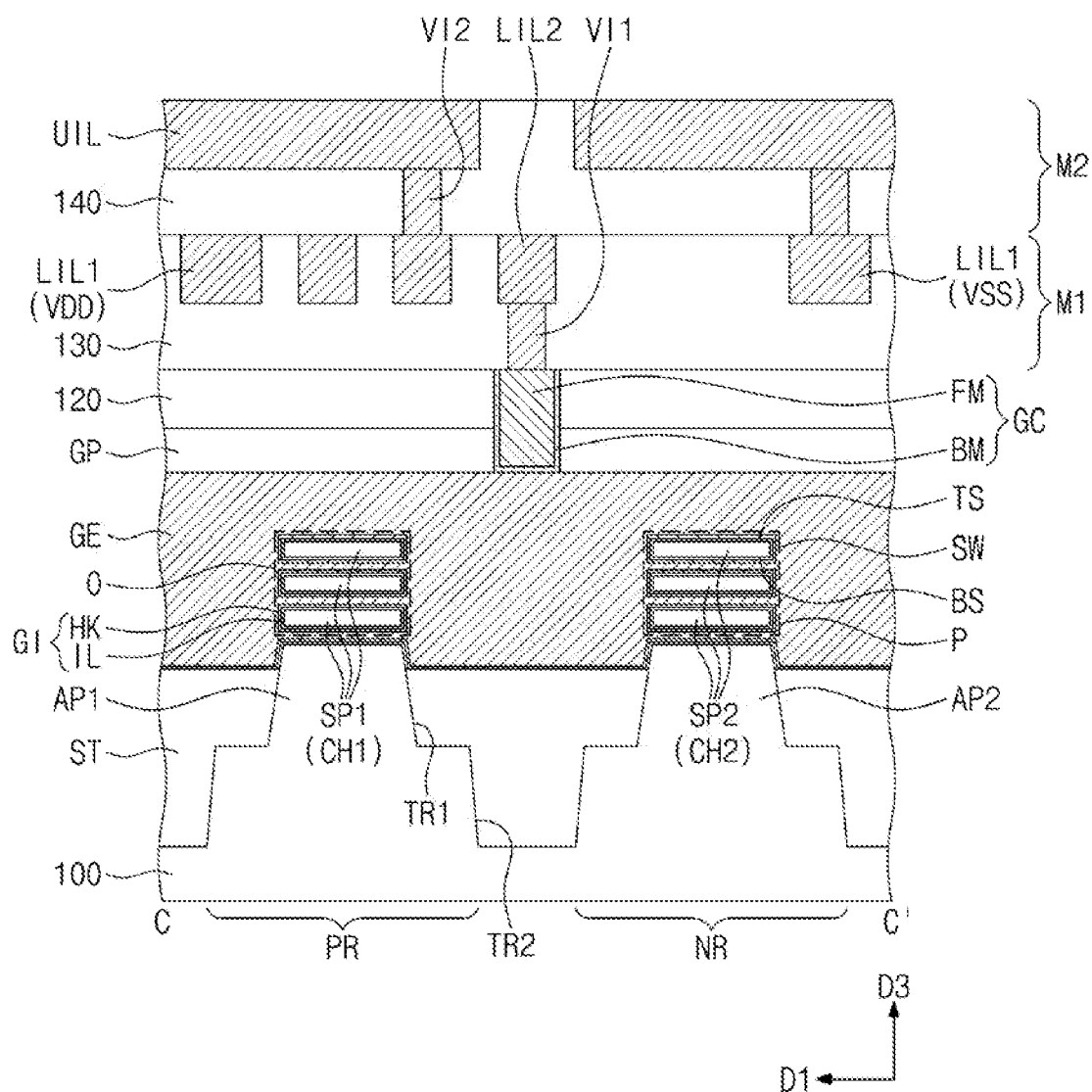
Figure 19D:
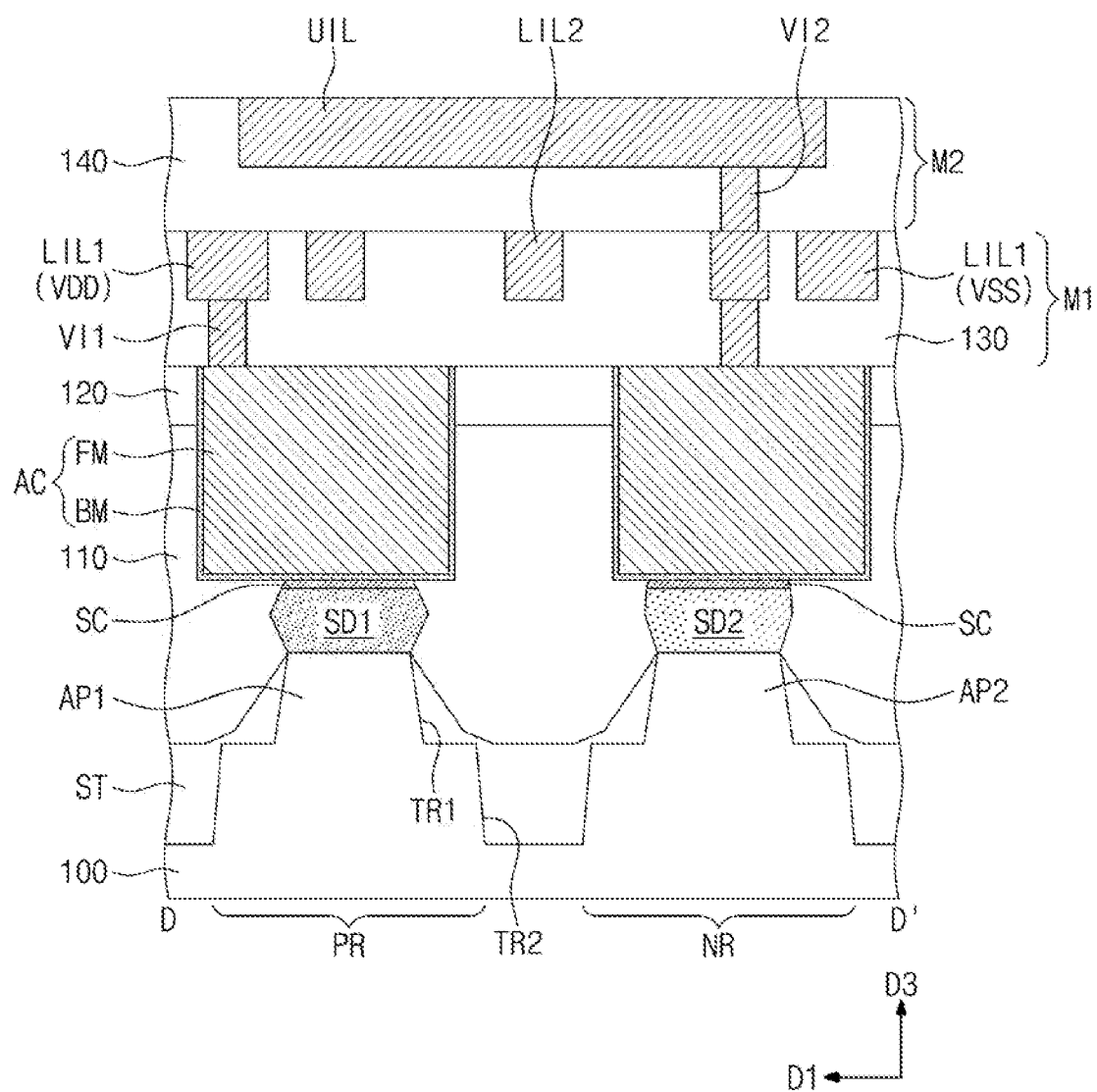
Figure 20A:
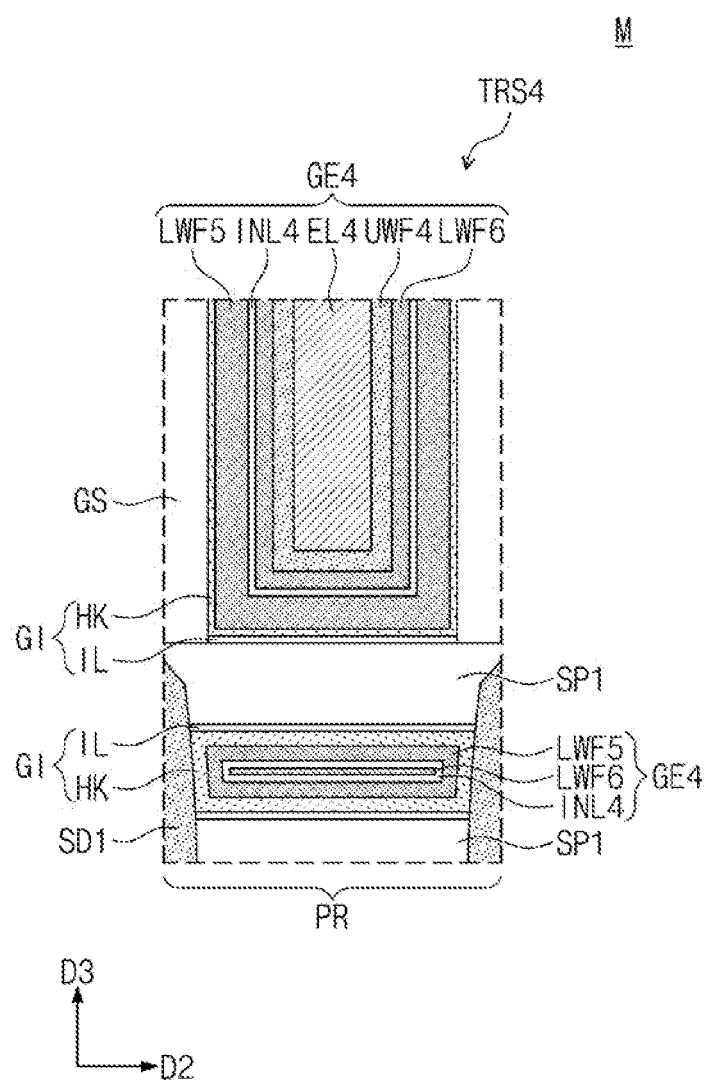
FIG. 20A illustrates an enlarged cross-sectional view of section M of FIG. 19A.
Figure 20B:
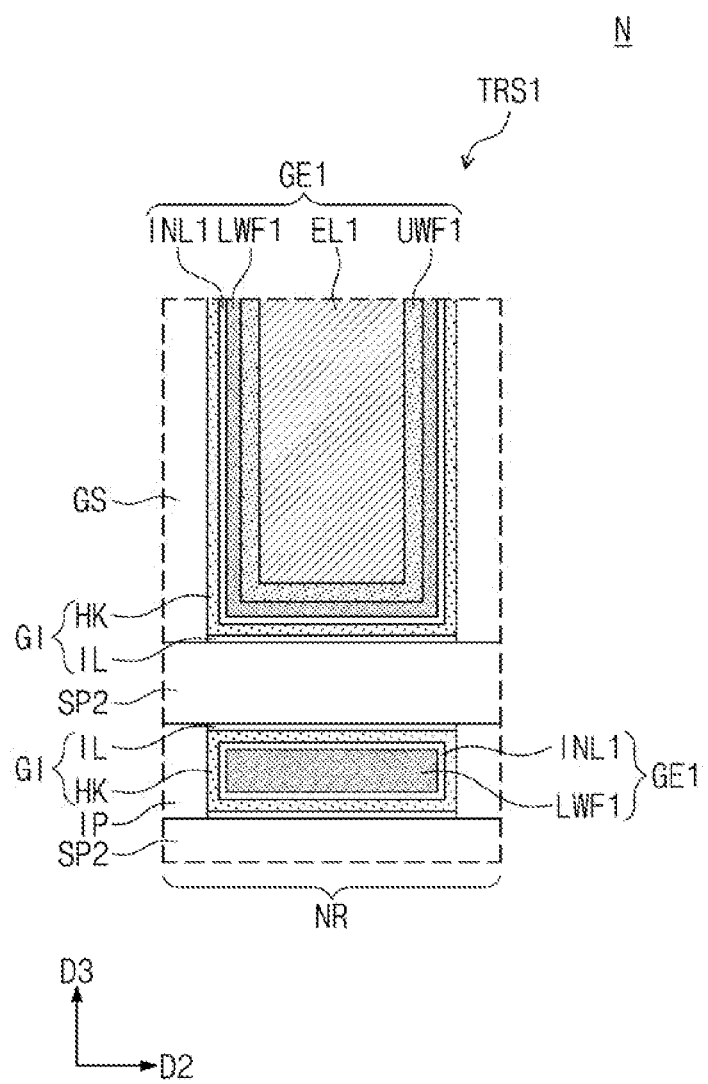
FIG. 20B illustrates an enlarged cross-sectional view of section N of FIG. 19B.
Figure 20C:
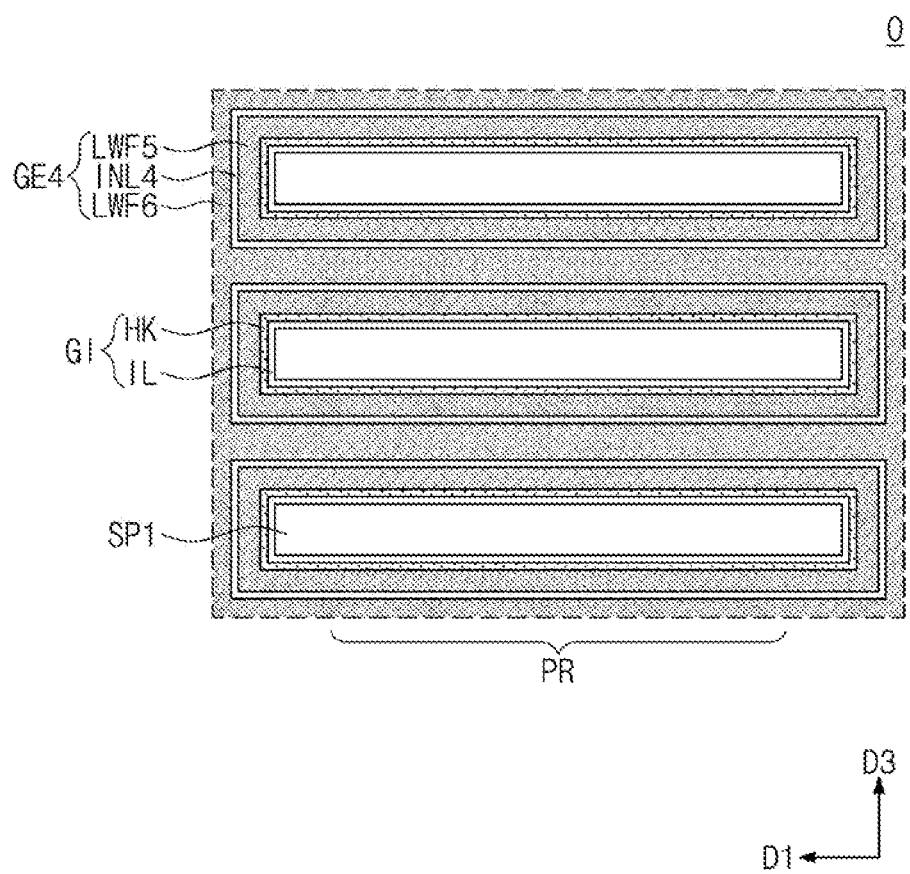
FIG. 20C illustrates an enlarged cross-sectional view of section O of FIG. 19C.
Figure 20D:
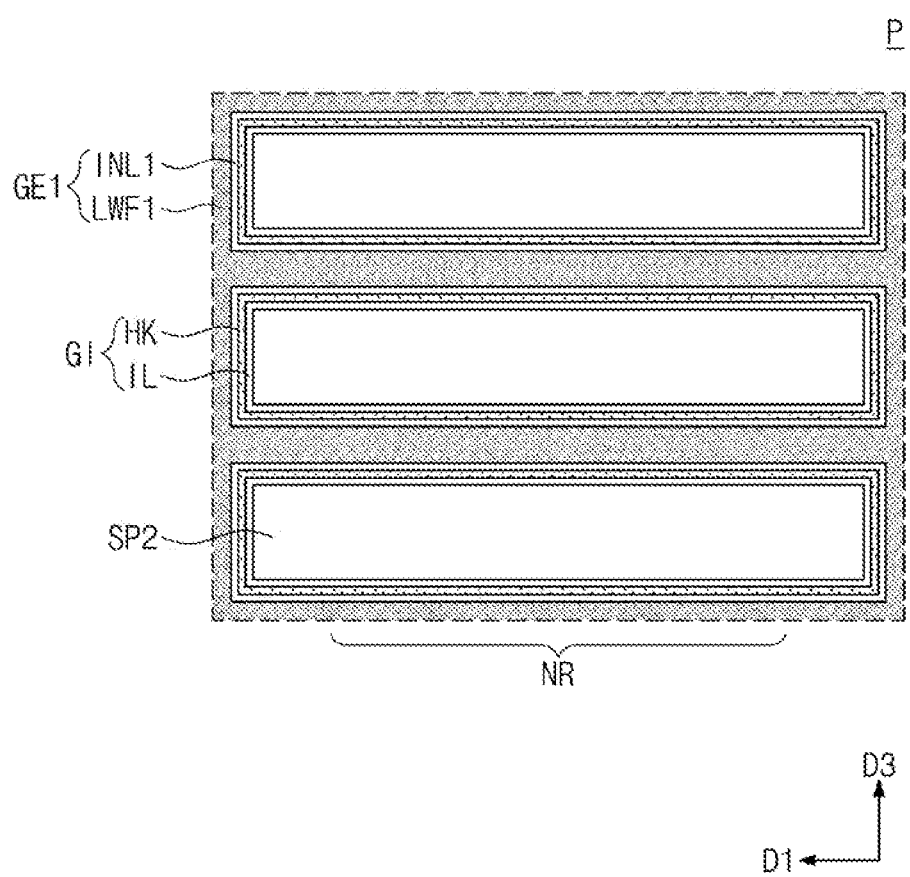
FIG. 20D illustrates an enlarged view of section P of FIG. 19C.

The gate electrode GE may surround the first and second channel patterns CH1 and CH2 (see FIG. 19C). The gate electrode GE may be on a top surface TS, a bottom surface BS, and a sidewall SW of each of the first and second channel patterns CH1 and CH2. In an implementation, the gate electrode GE may surround the top surface TS, the bottom surface BS, and the sidewall SW of each of the first and second channel patterns CH1 and CH2. A transistor according to the present embodiment may be a threedimensional field effect transistor (e.g., MBCFET) in which the gate electrode GE three-dimensionally surrounds the first and second channel patterns CH1 and CH2.

A gate dielectric layer GI may be between the gate electrode GE and each of the first and second channel patterns CH1 and CH2. The gate dielectric layer GI may surround each of the first and second channel patterns CH1 and CH2. The gate dielectric layer GI may include an interfacial layer IL and a high-k dielectric layer HK on the interfacial layer IL.

On the NMOSFET region NR, a dielectric pattern IP may be between the gate dielectric layer GI and the second source/drain pattern SD2. The gate dielectric layer GI and the dielectric pattern IP may separate the gate electrode GE from the second source/drain pattern SD2. In an implementation, the dielectric pattern IP may be omitted from the PMOSFET region PR.

The gate electrode GE will be further discussed in detail with reference to FIGS. 20A to 20D. For convenience of description, the first gate electrode GE1 and the fourth gate electrode GE4 are illustrated as a portion of one gate electrode GE, but the first gate electrode GE1 and the fourth gate electrode GE4 may be different gate electrodes GE from each other.

Referring to FIGS. 20A and 20C, the fourth gate electrode GE4 on the PMOSFET region PR may constitute the fourth transistor TRS4. The fifth lower metal pattern LWF5, the fourth intermediate pattern INL4, and the sixth lower metal pattern LWF6 may be between the first semiconductor patterns SP1 that are adjacent to each other in the third direction D3. The fourth intermediate pattern INL4 may be between the fifth lower metal pattern LWF5 and the sixth lower metal pattern LWF6. The fourth intermediate pattern INL4 may surround the sixth lower metal pattern LWF6. The fifth lower metal pattern LWF5 may surround the fourth intermediate pattern INL4.

Referring to FIGS. 20B and 20D, the first gate electrode GE1 on the NMOSFET region NR may constitute the first transistor TRS1. The first intermediate pattern INL1 and the first lower metal pattern LWF1 may be between the second semiconductor patterns SP2 that are adjacent to each other in the third direction D3. The first intermediate pattern INL1 may surround the first lower metal pattern LWF1. In an implementation, the intermediate pattern INL and the lower metal pattern LWF may be between neighboring first semiconductor patterns SP1 or between neighboring second semiconductor patterns SP2.

A portion of the gate electrode GE on an uppermost first semiconductor pattern SP1 and an uppermost second semiconductor pattern SP2 may have a structure discussed with reference to FIG. 3. In an implementation, the upper metal pattern UWF and the electrode pattern EL may further be on the uppermost first semiconductor pattern SP1 and the uppermost second semiconductor pattern SP2.

By way of summation and review, scaling down of MOSFETs could deteriorate operating characteristics of the semiconductor device. Semiconductor devices may be fabricated having superior performance while overcoming issues associated with high integration of the semiconductor devices.

According to some embodiments, a gate electrode may be provided therein with an intermediate pattern which includes lanthanum oxide and whose thickness is less than that of a lower work-function pattern. The intermediate pattern may be in the gate electrode, and it may be possible to prevent a leakage current to the gate electrode. Accordingly, a semiconductor device may exhibit improved electrical properties.

One or more embodiments may provide a semiconductor device including a field effect transistor.

One or more embodiments may provide a semiconductor device that prevents a leakage current to a gate electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate that includes a PMOSFET region and an NMOSFET region; and
    a first transistor on the PMOSFET region and a second transistor on the NMOSFET region,
    wherein:
    the first transistor includes:
        a first gate dielectric layer on the substrate;
        a first lower metal pattern on the first gate dielectric layer;
        a second lower metal pattern on the first lower metal pattern; and
        a first intermediate pattern between the first lower metal pattern and the second lower metal pattern,
    the second transistor includes:
        a second gate dielectric layer on the substrate;
        a third lower metal pattern on the second gate dielectric layer; and
        a second intermediate pattern between the second gate dielectric layer and the third lower metal pattern,
    the first intermediate pattern and the second intermediate pattern each include lanthanum,
    the first lower metal pattern, the second lower metal pattern, and the third lower metal pattern each include a metal nitride,
    a thickness of the first lower metal pattern is greater than a thickness of the third lower metal pattern;
    a lanthanum concentration of the second lower metal pattern increases with decreasing distance from the first intermediate pattern, and
    a lanthanum concentration of the first lower metal pattern increases with decreasing distance from the first intermediate pattern.

2. The semiconductor device as claimed in claim 1, wherein the metal nitride of the first to third lower metal patterns includes titanium nitride or tantalum nitride.

3. The semiconductor device as claimed in claim 1, wherein the thickness of the first lower metal pattern is greater than a thickness of the second lower metal pattern.

4. The semiconductor device as claimed in claim 1, wherein:
    a thickness of the first gate dielectric layer is less than a thickness of the second gate dielectric layer, and
    a lanthanum concentration of the first gate dielectric layer is less than a lanthanum concentration of the second gate dielectric layer.

5. The semiconductor device as claimed in claim 1, wherein:
    the first transistor further includes an upper metal pattern on the second lower metal pattern, and
    the upper metal pattern includes at least one material selected from the group consisting of titanium aluminum carbide, titanium aluminum nitride, titanium aluminum carbonitride, and titanium aluminum.

6. The semiconductor device as claimed in claim 5, wherein:
    a lanthanum concentration of the second lower metal pattern increases with increasing distance from the upper metal pattern, and
    a lanthanum concentration of the first lower metal pattern decreases with increasing distance from the upper metal pattern.

7. The semiconductor device as claimed in claim 1, wherein a thickness of the first intermediate pattern is less than the thickness of the first lower metal pattern and a thickness of the second lower metal pattern.

8. The semiconductor device as claimed in claim 1, further comprising a third transistor on the PMOSFET region,
wherein:
the third transistor includes:
a third gate dielectric layer on the substrate;
a fourth lower metal pattern on the third gate dielectric layer;
a fifth lower metal pattern on the fourth lower metal pattern; and
a third intermediate pattern between the fourth lower metal pattern and the fifth lower metal pattern, and
a thickness of the fourth lower metal pattern is greater than the thickness of the first lower metal pattern.

9. The semiconductor device as claimed in claim 8, wherein a lanthanum concentration of the third gate dielectric layer is greater than a lanthanum concentration of the first gate dielectric layer.

10. The semiconductor device as claimed in claim 1, further comprising a plurality of semiconductor patterns that are sequentially stacked and spaced apart from each other on the PMOSFET region,
wherein the first lower metal pattern surrounds a top surface, a bottom surface, and sidewalls of each of the semiconductor patterns.

11. A semiconductor device, comprising:
a substrate that includes a PMOSFET region and an NMOSFET region; and
a first transistor on the PMOSFET region,
wherein:
the first transistor includes:
a first gate dielectric layer on the substrate;
a first lower metal pattern on the first gate dielectric layer;
a second lower metal pattern on the first lower metal pattern; and
an upper metal pattern on the second lower metal pattern,
the first lower metal pattern and the second lower metal pattern each include a metal nitride,
the upper metal pattern includes aluminum,
a lanthanum concentration of the second lower metal pattern increases with increasing distance from the upper metal pattern, and
a lanthanum concentration of the first lower metal pattern decreases with increasing distance from the upper metal pattern.

12. The semiconductor device as claimed in claim 11, wherein:
the first transistor further includes a first intermediate pattern between the first lower metal pattern and the second lower metal pattern, and
the first intermediate pattern includes lanthanum oxide.

13. The semiconductor device as claimed in claim 11, further comprising a second transistor on the NMOSFET region,
wherein:
the second transistor includes:
a second gate dielectric layer on the substrate;
a third lower metal pattern on the second gate dielectric layer; and
a first intermediate pattern between the second gate dielectric layer and the third lower metal pattern,
the first intermediate pattern includes lanthanum oxide, and
the third lower metal pattern includes a metal nitride.

14. The semiconductor device as claimed in claim 13, further comprising a third transistor on the PMOSFET region,
wherein:
the third transistor includes:
a third gate dielectric layer on the substrate;
a fourth lower metal pattern on the third gate dielectric layer;
a fifth lower metal pattern on the fourth lower metal pattern; and
a second intermediate pattern between the fourth lower metal pattern and the fifth lower metal pattern, and
a threshold voltage of the third transistor is less than a threshold voltage of the first transistor.

15. The semiconductor device as claimed in claim 11, wherein a thickness of the second lower metal pattern is greater than a thickness of the first lower metal pattern.

16. A semiconductor device, comprising:
a substrate including a PMOSFET region and an NMOSFET region that are spaced apart from each other in a first direction;
a first active pattern on the PMOSFET region and a second active pattern on the NMOSFET region;
a first source/drain pattern on the first active pattern and a second source/drain pattern on the second active pattern;
a first gate electrode that runs across the first active pattern and a second gate electrode that runs across the second active pattern, the first gate electrode and the second gate electrode each extending in the first direction;
a first gate dielectric layer between the first active pattern and the first gate electrode and a second gate dielectric layer between the second active pattern and the second gate electrode, the first gate dielectric layer and the second gate dielectric layer each including an interfacial layer and a high-k dielectric layer on the interfacial layer;
a gate spacer on each of sidewalls of the first gate electrode and the second gate electrode;
a gate capping pattern on each of top surfaces of the first gate electrode and the second gate electrode;
a first interlayer dielectric layer on the gate capping pattern;
an active contact that penetrates the first interlayer dielectric layer and is coupled to one of the first source/drain pattern or the second source/drain pattern;
a gate contact that penetrates the first interlayer dielectric layer and is coupled to one of the first gate electrode or the second gate electrode;
a second interlayer dielectric layer on the first interlayer dielectric layer;
a first metal layer in the second interlayer dielectric layer, the first metal layer including a plurality of lower lines electrically connected to the active contact and the gate contact;
a third interlayer dielectric layer on the second interlayer dielectric layer; and
a second metal layer in the third interlayer dielectric layer,
wherein:
the second metal layer includes a plurality of upper lines electrically connected to corresponding lower lines,
the first gate electrode includes:
a first lower metal pattern on the first gate dielectric layer;

a second lower metal pattern on the first lower metal pattern;

a first intermediate pattern between the first lower metal pattern and the second lower metal pattern; and a first upper metal pattern on the second lower metal pattern, the second gate electrode includes:

a third lower metal pattern on the second gate dielectric layer;

a second intermediate pattern between the second gate dielectric layer and the third lower metal pattern; and a second upper metal pattern on the third lower metal pattern, the first intermediate pattern and the second intermediate pattern each include lanthanum, the first lower metal pattern, the second lower metal pattern, and the third lower metal pattern each include a metal nitride;

a lanthanum concentration of the second lower metal pattern increases with decreasing distance from the first intermediate pattern, and a lanthanum concentration of the first lower metal pattern increases with decreasing distance from the first intermediate pattern.

17. The semiconductor device as claimed in claim 16, wherein a thickness of the first lower metal pattern is greater than a thickness of the second lower metal pattern.

18. The semiconductor device as claimed in claim 16, wherein:

a lanthanum concentration of the second lower metal pattern increases with increasing distance from the first upper metal pattern, and a lanthanum concentration of the first lower metal pattern decreases with increasing distance from the first upper metal pattern.

19. The semiconductor device as claimed in claim 16, wherein the first upper metal pattern and the second upper metal pattern each include at least one material selected from the group consisting of titanium aluminum carbide, titanium aluminum nitride, titanium aluminum carbonitride, and titanium aluminum.

20. The semiconductor device as claimed in claim 16, further comprising:

a third gate electrode that runs across the first active pattern; and a third gate dielectric layer between the first active pattern and the third gate electrode, wherein:

the third gate electrode includes:

a fourth lower metal pattern on the third gate dielectric layer;

a fifth lower metal pattern on the fourth lower metal pattern;

a third intermediate pattern between the fourth lower metal pattern and the fifth lower metal pattern; and a third upper metal pattern on the fifth lower metal pattern, a thickness of the fourth lower metal pattern is greater than a thickness of the first lower metal pattern.

* * * * *